(12) United States Patent
Michaelis et al.

(10) Patent No.: US 11,479,477 B2
(45) Date of Patent: Oct. 25, 2022

(54) COPPER-DOPED DOUBLE PEROVSKITES AND USES THEREOF

(71) Applicant: The Governors of the University of Alberta, Edmonton (CA)

(72) Inventors: Vladimir Michaelis, Edmonton (CA); Abhoy Karmakar, Edmonton (CA)

(73) Assignee: The Governors of the University of Alberta, Edmonton (CA)

( * ) Notice: Subject to any disclaimer, the term of this patent is extended or adjusted under 35 U.S.C. 154(b) by 0 days.

(21) Appl. No.: 16/909,072

(22) Filed: Jun. 23, 2020

(65) Prior Publication Data

US 2020/0407236 A1    Dec. 31, 2020

Related U.S. Application Data

(60) Provisional application No. 62/866,894, filed on Jun. 26, 2019.

(51) Int. Cl.
*C01G 30/00* (2006.01)
*H01G 9/00* (2006.01)
(Continued)

(52) U.S. Cl.
CPC ......... *C01G 30/003* (2013.01); *H01G 9/0036* (2013.01); *H01G 9/2009* (2013.01); *H01L 35/24* (2013.01); *H01L 35/34* (2013.01); *H01L 41/20* (2013.01); *H01L 41/47* (2013.01); *H01L 51/0007* (2013.01); *H01L 51/0028* (2013.01);
(Continued)

(58) Field of Classification Search
CPC ...... C01G 30/003; C01G 5/02; H01G 9/0036; H01G 9/2009; H01L 51/4253; H01L 51/0007; H01L 51/0028; H01L 51/42; H01L 35/24; H01L 35/34; H01L 35/12; H01L 31/072; H01L 31/0264; H02S 10/30; C01P 2002/77; C01P 2002/34; C01P 2002/84; C01P 2002/86; C01P 2002/74; C01P 2002/72; C01P 2002/54; C01P 2002/85; C01P 2002/88; C01P 2006/40;
(Continued)

(56) References Cited

U.S. PATENT DOCUMENTS 10,087,366 B2   10/2018   Dohner et al.
2017/0194101 A1   7/2017   Karunadasa et al.
(Continued)

OTHER PUBLICATIONS

Filip, Phase Diagrams and Stability of Lead-Free Halide Double Perovskites Cs2BB'X6: B=Sb and Bi, B' =Cu, Ag, and Au, and X=Cl, Br, and I, J. Phys. Chem. C 2018, 122, 158-170 (Year: 2017).*
(Continued)

*Primary Examiner* — Devina Pillay
(74) *Attorney, Agent, or Firm* — Bereskin & Parr LLP/S.E.N.C.R.L., s.r.l.; Dominique Lambert

(57) ABSTRACT

The present application relates to copper-doped double perovskites, for example, copper-doped double perovskites of the formula (I) and to uses thereof, for example as low-bandgap materials such as a semiconducting material in a device. The present application also relates to methods of tuning the bandgap of a $Cs_2SbAgZ_6$ double perovskite (for example, wherein Z is Cl) comprising doping the double perovskite with copper.

$$Cs_2Sb_{1-a}Ag_{1-b}Cu_{2x}Z_6 \qquad (I)$$

20 Claims, 26 Drawing Sheets

(51) Int. Cl.

| | |
|---|---|
| *H01L 51/42* | (2006.01) |
| *H01L 51/00* | (2006.01) |
| *H01L 35/24* | (2006.01) |
| *H01L 35/34* | (2006.01) |
| *H01L 41/20* | (2006.01) |
| *H01L 41/47* | (2013.01) |
| *H01G 9/20* | (2006.01) |
| *H01L 31/072* | (2012.01) |
| *H01L 35/12* | (2006.01) |
| *H01L 31/0264* | (2006.01) |
| *H02S 10/30* | (2014.01) |

(52) U.S. Cl.
CPC ...... *H01L 51/4253* (2013.01); *C01P 2002/34* (2013.01); *C01P 2002/72* (2013.01); *C01P 2002/74* (2013.01); *C01P 2002/77* (2013.01); *C01P 2002/84* (2013.01); *C01P 2002/86* (2013.01); *C01P 2004/03* (2013.01); *C01P 2006/40* (2013.01); *H01L 31/0264* (2013.01); *H01L 31/072* (2013.01); *H01L 35/12* (2013.01); *H02S 10/30* (2014.12)

(58) Field of Classification Search
CPC ... C01P 2004/03; Y02E 10/542; Y02E 10/549
See application file for complete search history.

(56) References Cited

U.S. PATENT DOCUMENTS

2018/0277696 A1   9/2018  Karunadasa et al.
2018/0290897 A1*  10/2018  Snaith .................. C01G 30/006

OTHER PUBLICATIONS

Karmakar, Cu(II)-Doped Cs2SbAgCl6 Double Perovskite: A Lead-Free, Low-Bandgap Material, Chem. Mater. 2018, 30, 8280-8290 (Year: 2018).*
A. Karmakar et al., Cu(II)-Doped Cs2SbAgCl6 Double Perovskite: A Lead-Free, Low-Bandgap Material, Chem. Mater., 2018, pp. 8280-8290.
Abdelhady et al., Heterovalent Dopant Incorporation for Bandgap and Type Engineering of Perovskite Crystals, J. Phys. Chem. Lett, Jan. 21, 2016, vol. 7(2), pp. 295-301.
Abram et al., Heavily doped semiconductors and devices, Adv. Phys., Aug. 9, 1978, vol. 27(1), pp. 799-892.
Pantaler et al., Hysteresis-Free Lead-Free Double-Perovskite Solar Cells by Interface Engineering, ACS Energy Lett, Jun. 26, 2018, vol. 3(8), pp. 1781-1786.
Shao et al., White light emission in Bi3+/Mn2+ ion co-doped CsPbCl3 perovskite nanocrystalst, Nanoscale, 2018, vol. 10, pp. 1023-1029.
Singhal et al., Low-Bandgap Cs4CuSb2Cl12 Layered Double Perovskite: Synthesis, Reversible Thermal Changes, and Magnetic Interaction, ACES, 2018, vol. 13(16), pp. 2085-2092.
Slavney et al., Small-Band-Gap Halide Double Perovskites, Angew. Chem, Aug. 7, 2018, vol. 57(39), pp. 12765-12770.
Slavney et al., A Bismuth-Halide Double Perovskite with Long Carrier Recombination Lifetime for Photovoltaic Applications, JACS, Feb. 7, 2016, vol. 138(7), pp. 2138-2141.
Slavney et al., Defect-Induced Band-Edge Reconstruction of a Bismuth-Halide Double Perovskite for Visible-Light Absorption, JACS, Mar. 29, 2017, vol. 139(14), pp. 5015-5018.
Tran et al., Designing indirect-direct bandgap transitions in double perovskites†, Mater. Horiz., 2017, vol. 4, pp. 688-693.
Vargas et al., A Direct Bandgap Copper-Antimony Halide Perovskite, JACS, Jul. 12, 2017, vol. 139(27), pp. 9116-9119.
Volonakis et al., Lead-Free Halide Double Perovskites via Heterovalent Substitution of Noble Metals, J. Phys. Chem. Lett, Mar. 16, 2016, vol. 7(7), pp. 1254-1259.
Volonakis et al., Cs 2 InAgCl 6: A New Lead-Free Halide Double Perovskite with Direct Band Gap, J. Phys. Chem. Lett., Feb. 16, 2017, vol. 8(4), pp. 772-778.
Wei et al., Synthesis and Properties of a Lead-Free Hybrid Double Perovskite: (CH3NH3)2AgBiBr6, Chem. Mater., Jan. 6, 2017, vol. 29(3), pp. 1089-1094.
Zhou et al., Metal-Doped Lead Halide Perovskites: Synthesis, Properties, and Optoelectronic Applications, Chem. Mater., Aug. 27, 2018, vol. 30(19), pp. 6589-6613.
Babayigit et al., Toxicity of organometal halide perovskite solar cells, Nat. Mat., Feb. 24, 2016, vol. 15, pp. 247-251.
Babu et al., Recent Advances in Halide-Based Perovskite Crystals and Their Optoelectronic Applications, Cryst. Growth Des., Feb. 23, 2018, vol. 18(4), pp. 2645-2664.
Bekenstein et al., The Making and Breaking of Lead-Free Double Perovskite Nanocrystals of Cesium Silver-Bismuth Halide Compositions, Nano Lett., May 2, 2018, vol. 18(6), pp. 3502-3508.
Berhe et al., Organometal halide perovskite solar cells: degradation and stability, Energy Environ. Sci, 2016, vol. 9(2), pp. 323-356.
Connor et al., Layered Halide Double Perovskites: Dimensional Reduction of Cs2AgBiBr6, JACS, Mar. 25, 2018, vol. 140(15), pp. 5235-5240.
Cortecchia et al., Lead-Free MA2CuClxBr4-x Hybrid Perovskites, Inorg. Chem., Jan. 12, 2016, vol. 55(3), pp. 1044-1052.
Creutz et al., Colloidal Nanocrystals of Lead-Free Double-Perovskite (Elpasolite) Semiconductors: Synthesis and Anion Exchange to Access New Materials, Nano Lett, Jan. 27, 2018, vol. 18(2), pp. 1118-1123.
Das Adhikari et al., Layered Perovskites L2(Pb1—xMnx)Cl4 to Mn-Doped CsPbCl3 Perovskite Platelets, ACS Energy Lett., May 3, 2018, 3, pp. 1247-1253.
Deng et al., Synthesis of Cs2AgSbCl6 and improved optoelectronic properties of Cs2AgSbCl6/TiO2 heterostructure driven by the interface effect for lead-free double perovskites solar cells, Appl. Phys. Lett., 2017, 111, p. 151602-1-151602-5.
Du et al., Bandgap Engineering of Lead-Free Double Perovskite Cs2AgBiBr6 through Trivalent Metal Alloying, Angew. Chem., Jul. 3, 2017, vol. 56(28), pp. 8158-8162.
Eperon et al., Perovskite-perovskite tandem photovoltaics with optimized band gaps, Science, Nov. 18, 2016, vol. 354(6314), pp. 861-865.
Filip et al., Phase Diagrams and Stability of Lead-Free Halide Double Perovskites Cs2BB'X6: B=Sb and Bi, B'=Cu, Ag, and Au, and X=Cl, Br, and I, J. Phys. Chem., 2018, vol. 122(1), pp. 158-170.
Green et al., Solar cell efficiency tables (version 50), Prog. Photovoltaics, 2017, 25, pp. 668-676.
Greul et al., Highly stable, phase pure Cs2AgBiBr6 double perovskite thin films for optoelectronic applications†, J. Mater. Chem., 2017, 37, pp. 19972-19981.
Hu et al., Bismuth Incorporation Stabilized α-CsPbI3 for Fully Inorganic Perovskite Solar Cells, ACS Energy Lett., vol. 2 (10), 2017, pp. 2219-2227.
Jain et al., High-Throughput Screening of Lead-Free Perovskite-like Materials for Optoelectronic Applications, J. Phys. Chem., Mar. 16, 2017, vol. 121(13), pp. 7183-7187.
Jeon et al., Compositional engineering of perovskite materials for high-performance solar cells, Nature, Jan. 7, 2015, 517, pp. 476-480.
Klug et al., Tailoring metal halide perovskites through metal substitution: influence on photovoltaic and material properties†, Energy Environ. Sci., 2017, vol. 10(1), pp. 236-246.
Kojima et al., Organometal Halide Perovskites as Visible-Light Sensitizers for Photovoltaic Cells, JACS, Apr. 14, 2009, vol. 131(17), pp. 6050-6051.
Lau et al., Strontium-Doped Low-Temperature-Processed CsPbI2Br Perovskite Solar Cells, ACS Energy Lett., 2017, 2, pp. 2319-2325.
McClure et al., Cs2AgBiX6 (X=Br, Cl): New Visible Light Absorbing, Lead-Free Halide Perovskite Semiconductors, Chem. Mater., Feb. 10, 2016, vol. 28(5), pp. 1348-1354.
Nandha K et al., Synthesis and luminescence of Mn-doped Cs2AgInCl6 double perovskitest, ChemComm., 2018, 54, pp. 5205-5208.

(56) References Cited

OTHER PUBLICATIONS

Nayak et al., Impact of Bi3+ Heterovalent Doping in Organic-Inorganic Metal Halide Perovskite Crystals, JACS, 2018, vol. 140(2), pp. 574-577.
Needleman et al., Lead Poisoning, Annu. Rev. Med., 2004, 55, pp. 209-222.

* cited by examiner

COPPER-DOPED DOUBLE PEROVSKITES AND USES THEREOF

RELATED APPLICATIONS

The present application claims the benefit of priority of U.S. provisional patent application No. 62/866,894 filed on Jun. 26, 2019, the contents of which are incorporated herein by reference in their entirety.

FIELD

The present application relates to copper-doped double perovskites, for example, copper-doped double perovskites of the general formula $Cs_2Sb_{1-a}Ag_{1-b}Cu_{2x}Cl_6$ and to uses thereof, for example as low-bandgap materials.

BACKGROUND

With an impressive increase in photoconversion efficiency (PCE) within the past decade,[1] hybrid organic-inorganic lead halide perovskites have prompted global research due to their potential use in high-efficiency solar cell technologies. However, despite their promising electronic properties and low production costs for photovoltaic and optoelectronic applications,[2] commercialization of lead halide perovskites has been hindered, for example, by their instability[3] as well as by long-term health and environmental concerns[4] for example, related to the leaching of $Pb^{2+}$ due to their water solubility.[5]

The general formula for perovskites of recent interest in photovoltaic research is $ABX_3$, where $A=Cs^+$, $MA^+$, or $FA^+$ (wherein MA=methylammonium, FA=formamidinium), $B=Pb^{2+}$ or $Sn^{2+}$, and $X=Cl^-$, $Br^-$, or $I^-$. To improve the photovoltaic efficiency and stability of metal halide perovskites, alternative synthetic design approaches have included the incorporation of A-site mixed cations[2(d),6] and mixed halides[7] as well as isovalent ($Sn^{2+}$, $Co^{2+}$, $Sr^{2+}$)[8] or heterovalent ($Bi^{3+}$, $Au^{3+}$, $In^{3+}$)[9] B-site cations. These modifications influence the photovoltaic performance and optical properties and can lead to enhanced stability.[10] Although $MASnI_3$ may be a less toxic alternative to the isoelectronic $Pb^{2+}$ sister materials, displaying a bandgap of 1.15 eV,[11] it is unstable under ambient conditions due to rapid oxidation to $Sn^{4+}$ which negatively impacts the photovoltaic properties of the material.[12]

Research has shown that replacing the B-site cation with a combination of trivalent (B'), and monovalent (B") cations results in the formation of $A_2B'B''X_6$ double perovskites that mimic the $ABX_3$ perovskite structure while displaying desirable air and moisture stability,[13] as well as bandgap tunability.[14] For example, $Cs_2BiAgX_6$ (X=Cl, Br) shows visible light absorption with indirect bandgaps of 2.77 and 1.95 eV for X=Cl and Br, respectively.[13(a),13(c)] Similar bandgap tunability also has been observed by alloying of $Sb^{3+}$ and $In^{3+}$ in $Cs_2BiAgBr_6$.[14(a)] In 2017, Deng et al.[15] successfully synthesized $Cs_2SbAgCl_6$ double perovskites with an indirect bandgap of 2.6 eV, while Tran et al.[14(b)] prepared a series of B'-site mixed-cationic $Cs_2(Sb_xIn_{1-x})AgCl_6$ ($0 \leq x \leq 1$) double perovskites that show an indirect to direct bandgap modification. The structural and photophysical properties of nanocrystals,[16] low-dimensional (i.e., 2D) double perovskites,[17] hysteresis-free solar cells,[18] and highly stable thin films[19] of $Cs_2BiAgBr_6$ double perovskite have recently been reported. A small bandgap Tl-containing $Cs_2AgTlBr_6$ double perovskite has emerged;[20] however, the acute toxicity of thallium makes it ill-suited to replace lead. A new class of layered double perovskite, namely, $Cs_4CuSb_2Cl_{12}$, displays a reduced bandgap, although at the cost of photovoltaic efficiency due to the restriction in structural dimensionality.[21] A less-toxic, low-bandgap (ca. 1-1.4 eV) 3D double perovskite material synthesized from inexpensive and highly abundant elements remains desirable.

Altering the optical and electronic properties for semiconductors is a useful approach in modern device applications.[22] For example, homo- and heterovalent metal ion doped lead halide perovskites have been reported to enhance the optical and electronic properties of both nanocrystalline[23] and bulk materials.[9,12,24] Additionally, for example, Slavney et al.[14(c)] reduced the bandgap of $Cs_2BiAgBr_6$ by successful Tl doping, and Nandha and Nag[25] enhanced the visible light emission properties of $Cs_2InAgCl_6$ via $Mn^{2+}$ doping.

The $ns^2$ outer shell electronic configuration of the B-site in the 3D $ABX_3$ ($B=Pb^{2+}$, $Sn^{2+}$) perovskite structure is responsible for strong direct bandgap absorption and superior photovoltaic properties. Occupied and unoccupied $6s^2$ and $6p^0$ orbitals, respectively, of $Pb^{2+}$ contribute to form valence band maximum (VBM) and conduction band minimum (CBM), respectively.[26] $A_2B'B''X_6$ double perovskites allow a large diversity of B'- and B"-sites and hence diverse orbital compositions in its band edges. Because double perovskite materials exhibit dominant metal-to-metal charge transfer (MMCT), their electronic band structure relies heavily on the energies of B'- and B"-site metals' frontier orbitals.[20] For example, it has been shown when $Pb^{2+}$ is replaced with isoelectronic $Bi^{3+}$ and $Tl^+$ in $MA_2BiTlBr_6$, a direct bandgap material is formed, whereas replacing Tl+ with $Ag^+$ yields an indirect bandgap material, $Cs_2BiAgBr_6$.[13(c),14(c)] Similarly, the $Cs_2SbAgCl_6$ double perovskite shows an indirect bandgap transition, where the Sb-5s/Ag-4d and Sb-5p orbitals are the main contributors to the VBM and CBM, respectively.[14(b)]

Vargas et al. have reported a layered 2D double perovskite, $Cs_4Sb_2CuCl_2$, that exhibits a direct transition with a narrow bandgap (ca. 1 eV) due to the presence of an unpaired electron in $Cu^{2+}$ ($3d^9$ configuration).[21(a)] The $[CuCl_6]^{4-}$ octahedra are inserted between $[SbCl_6]^{3-}$ layers, corner sharing to each $[SbCl_6]^{3-}$ neighbor in the extended crystalline structure. These corner-shared octahedra are similar to the 3D perovskite network, which is useful for their major photovoltaic success in lead-halide perovskites.[26] The much smaller bandgap of $Cs_4Sb_2CuCl_{12}$ is due to favorable orbital overlap of the Cu-3d orbitals with Cl and Sb orbitals, which broadens the VBM and minimizes the bandgap.[21(a)]

SUMMARY

Doped 3D double perovskite materials that yield reduced optical bandgaps, for example, for photovoltaic applications while maintaining useful properties are described herein. For example, the synthesis of a lead-free, inexpensive, and highly abundant element, heterovalent $Cu^{2+}$ doping analogue of $Cs_2SbAgCl_6$ with a bandgap of ca. 1 eV is described hereinbelow. This reduction in bandgap to about 1 eV is more suitable for the solar spectrum and therefore such materials may, for example, be a less toxic, inexpensive, and/or higher thermal and/or moisture stable photovoltaic material, in contrast to conventional hybrid inorganic-organic metal halide perovskites such as the commercialized methylammonium lead iodide ($MAPbI_3$) variant. In addition to nuclear magnetic resonance (NMR) spectroscopy, powder X-ray diffraction (PXRD) was used to confirm the crystalline structure and phase purity, while optical properties were obtained using diffuse reflectance (DR). Materials were further characterized using field emission scanning electron microscopy (FESEM), energy dispersive X-ray (EDX), electron paramagnetic resonance (EPR), and thermogravimetric analysis (TGA) techniques. The long-term stability to environmental thermal and humidity stimuli of the materials was tested to assess their potential for long-term use as photovoltaic materials. The material's long-term (up to 365 days) thermal and moisture stability indicates useful resistance to environmental exposure.

Accordingly, the present application includes a copper-doped double perovskite of the formula (I):

$$Cs_2Sb_{1-a}Ag_{1-b}Cu_{2x}Z_6 \tag{I}$$

wherein
Z is Cl or Br;
a+b=2x; and
x is in the range of from about 0.005 to about 0.25.

The present application also includes a device comprising a semiconducting material, wherein the semiconducting material comprises, consists essentially of or consists of a copper-doped double perovskite of the present application.

The present application also includes a method of tuning the bandgap of a $Cs_2SbAgZ_6$ double perovskite, wherein Z is Cl or Br, the method comprising doping the double perovskite with copper to obtain a copper-doped double perovskite of the formula (I):

$$Cs_2Sb_{1-a}Ag_{1-b}Cu_{2x}Z_6 \tag{I}$$

wherein
Z is Cl or Br;
a+b=2x; and
x is in the range of from about 0.005 to about 0.25.

Other features and advantages of the present application will become apparent from the following detailed description. It should be understood, however, that the detailed description and the specific examples while indicating embodiments of the application are given by way of illustration only, since various changes and modifications within the spirit and scope of the application will become apparent to those skilled in the art from this detailed description.

BRIEF DESCRIPTION OF THE DRAWINGS

The present application will now be described in greater detail with reference to the drawings in which:

FIG. 8 also shows full width at half maximum (FWHM) values of powder XRD patterns as a function of $Cu^{2+}$ content (x=0.00-0.10) (lower plot) according to embodiments of the present application.

FIG. 10 also shows the Tauc plots, which yield, assuming a direct allowed transition, bandgaps of 2.84 eV for $Cs_2SbAgCl_6$ (x=0.00) (lower left image), and 1.34 eV for the maximum $Cu^{2+}$ doped material (x=0.10) according to an embodiment of the present application (lower right image).

FIG. 21 also shows the temperature dependence of the $^{133}Cs$ chemical shift of Peak-3 (right image); the asterisks (*) and crosses (†) indicate spinning sidebands and Peak-3, respectively.

FIG. 25 also shows (lower image) powder x-ray diffraction patterns for stability experiments of $Cs_2SbAgCl_6$ parent (x=0.00; lower three patterns) and the maximum $Cu^{2+}$-doped (x=0.10; upper three patterns) materials according to an embodiment of the present application under the conditions of, from top to bottom in each set: 55% relative humidity (RH) for 30 days, 110° C. for 6 days and freshly prepared.

FIG. 26 also shows thermogravimetric analysis (TGA) data for materials without (x=0.00) and with trace $Cu^{2+}$ doping (x=0.01 materials) according to an embodiment of the present application, showing similar thermal stability (lower image).

DETAILED DESCRIPTION

I. Definitions

Figure 1:
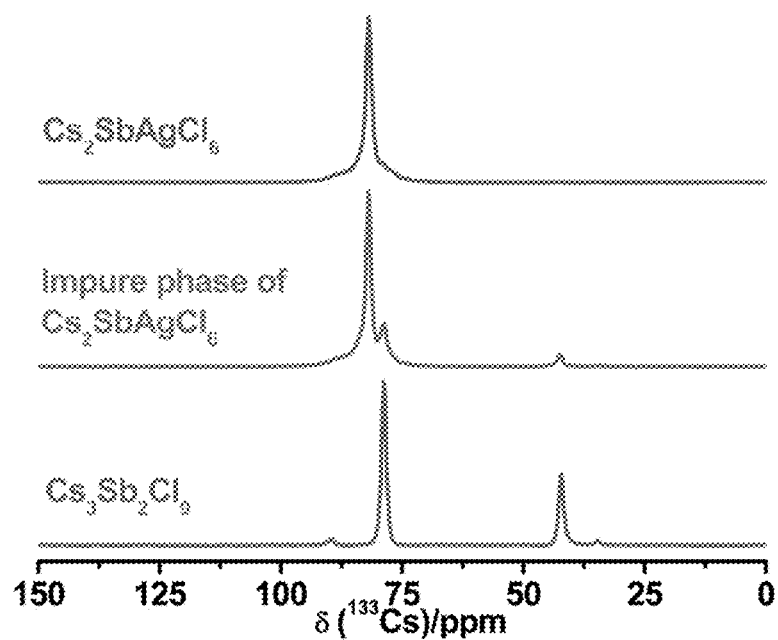
FIG. 1 shows cesium-133 magic-angle spinning (MAS) nuclear magnetic resonance (NMR) spectra for, from top to bottom in upper image: $Cs_2SbAgCl_6$ double perovskite, impure $Cs_2SbAgCl_6$ double perovskite and $Cs_3Sb_2Cl_9$ as well as two-dimensional $^{133}Cs$ exchange spectroscopy (EXSY) NMR ($B_0$=21.1 T; $\omega r/2\pi$=30 kHz) contour plots of $Cu^{2+}$-doped $Cs_2SbAgCl_6$ (x=0.10) according to an embodiment of the present application with 1 ms (medium grey lines) and 500 ms (darker grey lines) mixing times, showing no Cs exchange (lower image).
Figure 1:
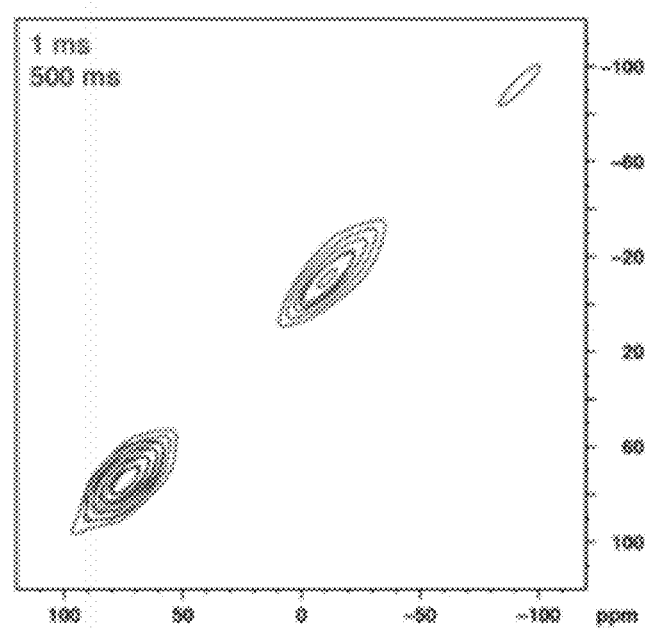

Unless otherwise indicated, the definitions and embodiments described in this and other sections are intended to be applicable to all embodiments and aspects of the present application herein described for which they are suitable as would be understood by a person skilled in the art.

In understanding the scope of the present application, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. The term "consisting" and its derivatives, as used herein, are intended to be closed terms that specify the presence of the stated features, elements, components, groups, integers, and/or steps, but exclude the presence of other unstated features, elements, components, groups, integers and/or steps. The term "consisting essentially of", as used herein, is intended to specify the presence of the stated features, elements, components, groups, integers, and/or steps as well as those that do not materially affect the basic and novel characteristic(s) of features, elements, components, groups, integers, and/or steps.

Terms of degree such as "substantially", "about" and "approximately" as used herein mean a reasonable amount of deviation of the modified term such that the end result is not significantly changed. These terms of degree should be construed as including a deviation of at least ±5% of the modified term if this deviation would not negate the meaning of the word it modifies.

The term "and/or" as used herein means that the listed items are present, or used, individually or in combination. In effect, this term means that "at least one of" or "one or more" of the listed items is used or present.

As used in this application, the singular forms "a", "an" and "the" include plural references unless the content clearly dictates otherwise.

The term "suitable" as used herein means that the selection of specific reagents or conditions will depend on the reaction being performed and the desired results, but nonetheless, can generally be made by a person skilled in the art once all relevant information is known.

II. Copper-Doped Double Perovskites and Methods of Preparation

Lead-free halide double perovskites with a generic formula of $A_2B'(III)B''(I)X_6$ (wherein A and B are cations and X is a halide anion) are being explored as a less toxic, higher thermal- and moisture-stable alternative to well-studied lead halide perovskite ($APbX_3$) solar energy absorbers. However, the absorption profiles of most double perovskites reported to date have larger bandgaps (>2 eV) that are poorly aligned with the solar spectrum, reducing their photoconversion efficiency. Herein, new heterovalent paramagnetic $Cu^{2+}$-doped $Cs_2SbAgCl_6$ double perovskites are presented that exhibited dramatic shifts in their bandgaps from about 2.6 eV ($Cs_2SbAgCl_6$, parent) to about 1 eV ($Cu^{2+}$-doped $Cs_2SbAgCl_6$). Powder X-ray diffraction patterns of the $Cu^{2+}$-doped polycrystalline materials indicated long-range crystallinity with nonuniform microstrain in the crystal lattice. To decode the dopant, complementary magnetic resonance spectroscopy techniques, solid-state nuclear magnetic resonance (NMR) and electron paramagnetic resonance (EPR), were used to unravel the short- and medium-range structure of these new double perovskite materials. Variable temperature $^{133}Cs$ NMR spectroscopy revealed that paramagnetic $Cu^{2+}$ ions are incorporated within the double perovskite material impacting the $^{133}Cs$ NMR through a Fermi contact interaction. A stress test of the material's long-term (up to 365 days) thermal and moisture stability indicated useful resistance to environmental exposure.

Accordingly, the present application includes a copper-doped double perovskite of the formula (I):

$$Cs_2Sb_{1-a}Ag_{1-b}Cu_{2x}Z_6 \qquad (I)$$

wherein
Z is Cl or Br;
a+b=2x; and
x is in the range of from about 0.005 to about 0.25.
In an embodiment, Z is Cl.
In an embodiment, x is in the range of from about 0.005 to about 0.015. In another embodiment, x is in the range of from about 0.01 to about 0.10. In a further embodiment, x is about 0.01, about 0.05 or about 0.10. In another embodiment of the present application, x is about 0.01. In another embodiment, x is about 0.05. In another embodiment, x is about 0.10.

In an embodiment, the copper-doped double perovskite has an optical indirect bandgap of less than 2.65 eV or less than 2 eV. In another embodiment, the copper-doped double perovskite has an optical indirect bandgap in the range of from about 1 eV to less than 2.65 eV. In another embodiment of the present application, the copper-doped double perovskite has an optical indirect bandgap of from about 1 eV to about 1.4 eV. In a further embodiment, the copper-doped double perovskite has an optical indirect bandgap of about 1 eV. In an embodiment, the optical indirect bandgap is as determined using a UV-Vis NIR spectrophotometer with each measurement being acquired between the wavelengths of 2500 nm and 200 nm.

In an embodiment, the copper-doped double perovskite has no substantial change in the optical indirect bandgap after being subjected to a relative humidity of about 55% at a temperature of about 295K, for a period of about 365 days. In another embodiment, the copper-doped double perovskite has no substantial change in $^{133}Cs$ magic-angle spinning nuclear magnetic resonance spectrum, powder x-ray diffraction pattern and/or absorption spectrum after being subjected to a relative humidity of about 55% for a period of about 365 days.

In an embodiment, the copper-doped double perovskite has no substantial change in the optical indirect bandgap after being subjected to a temperature of about 110° C. for a period of about 6 days. In another embodiment of the present application, the copper-doped double perovskite has no substantial change in $^{133}Cs$ magic-angle spinning nuclear magnetic resonance spectrum, powder x-ray diffraction pattern and/or absorption spectrum after being subjected to a temperature of about 110° C. for a period of about 6 days.

The present application also includes a method of tuning the bandgap of a $Cs_2SbAgZ_6$ double perovskite, wherein Z is Cl or Br, the method comprising doping the double perovskite with copper. In some embodiments, the method is to obtain a copper-doped double perovskite of the formula (I):

$$Cs_2Sb_{1-a}Ag_{1-b}Cu_{2x}Z_6 \qquad (I)$$

wherein
Z is Cl or Br;
a+b=2x; and
x is in the range of from about 0.005 to about 0.25.
In an embodiment, Z is Cl.
In some embodiments, the copper-doped double perovskite is prepared by a method comprising:
(i) dissolving $Sb_2O_3$ and AgCl in an aqueous solution comprising HCl; and
(ii) adding CsCl and $CuCl_2 \cdot 2H_2O$ to the solution obtained in step (i).

The person skilled in the art having regard to the present specification could readily select amounts of the various reagents to prepare a copper-doped perovskite having desired values of a, b and x.

In some embodiments, prior to addition of the solution obtained in step (i), the $CuCl_2 \cdot 2H_2O$ is dissolved in an aqueous solution comprising HCl.

In an embodiment, the $Sb_2O_3$ and AgCl are dissolved in the aqueous solution comprising HCl, while heating, for example, while heating at a temperature of from about 100° C. to about to 130° C. or about 120° C. In another embodiment, the aqueous solution comprising HCl is an about 10 M solution of HCl.

In an embodiment, the mixture obtained in step (ii) is heated for a time of about 0.5 to about 1.5 hours or about 2 hours then allowed to stand at ambient temperature for a time of about 1 hour to about 4 hours or about 2 hours. In an embodiment, the heating is at a temperature of from about 100° C. to about to 130° C. or about 120° C. In another embodiment, ambient temperature is in the range of from about 15° C. to about 40° C. or about 20° C. to about 25° C.

III. Devices and Uses

New heterovalent paramagnetic $Cu^{2+}$-doped $Cs_2SbAgCl_6$ double perovskites were prepared that exhibited dramatic shifts in their bandgaps from about 2.6 eV ($Cs_2SbAgCl_6$, parent) to about 1 eV ($Cu^{2+}$-doped $Cs_2SbAgCl_6$). This reduction in bandgap to about 1 eV is more suitable for the solar spectrum and therefore such materials may, for example, be a less toxic, inexpensive, and/or higher thermal and/or moisture stable photovoltaic material, in contrast to conventional hybrid inorganic-organic metal halide perovskites such as the commercialized methylammonium lead iodide ($MAPbI_3$) variant. Such materials may also be useful, for example, in other devices such as other photovoltaic devices, a thermoelectric device, a magneto-electric device and/or a magneto-optic device. A stress test of the material's long-term (up to 365 days) thermal and moisture stability indicated useful resistance to environmental exposure.

Accordingly, the present application also includes a device comprising a semiconducting material, wherein the semiconducting material comprises, consists essentially of or consists of a copper-doped double perovskite of the present application.

In an embodiment, the semiconducting material comprises the copper-doped double perovskite of the present application. In another embodiment, the semiconducting material consists essentially of the copper-doped double perovskite of the present application. In a further embodiment, the semiconducting material consists of the copper-doped double perovskite of the present application.

The present application also includes a use of a copper-doped double perovskite of the present application as a low-bandgap material. In an embodiment, the low-bandgap material is a semiconducting material in a device.

In an embodiment of the present application, the copper-doped double perovskite is of the formula (I):

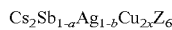
$$Cs_2Sb_{1-a}Ag_{1-b}Cu_{2x}Z_6 \quad (I)$$

wherein
Z is Cl or Br;
a+b=2x; and
x is in the range of from about 0.005 to about 0.25.
In an embodiment, Z is Cl.
In an embodiment, x is in the range of from about 0.005 to about 0.015. In another embodiment, x is in the range of from about 0.01 to about 0.10. In a further embodiment, x is about 0.01, about 0.05 or about 0.10. In another embodiment of the present application, x is about 0.01. In another embodiment, x is about 0.05. In another embodiment, x is about 0.10.

In an embodiment, the copper-doped double perovskite has an optical indirect bandgap of less than 2.65 eV or less than 2 eV. In another embodiment, the copper-doped double perovskite has an optical indirect bandgap in the range of from about 1 eV to less than 2.65 eV. In another embodiment of the present application, the copper-doped double perovskite has an optical indirect bandgap of from about 1 eV to about 1.4 eV. In a further embodiment, the copper-doped double perovskite has an optical indirect bandgap of about 1 eV. In an embodiment, the optical indirect bandgap is as determined using a UV-Vis NIR spectrophotometer with each measurement being acquired between the wavelengths of 2500 nm and 200 nm In an embodiment, the copper-doped double perovskite has no substantial change in the optical indirect bandgap after being subjected to a relative humidity of about 55% at a temperature of about 295K, for a period of about 365 days. In another embodiment, the copper-doped double perovskite has no substantial change in $^{133}Cs$ magic-angle spinning nuclear magnetic resonance spectrum, powder x-ray diffraction pattern and/or absorption spectrum after being subjected to a relative humidity of about 55% for a period of about 365 days.

In an embodiment, the copper-doped double perovskite has no substantial change in the optical indirect bandgap after being subjected to a temperature of about 110° C. for a period of about 6 days. In another embodiment of the present application, the copper-doped double perovskite has no substantial change in $^{133}Cs$ magic-angle spinning nuclear magnetic resonance spectrum, powder x-ray diffraction pattern and/or absorption spectrum after being subjected to a temperature of about 110° C. for a period of about 6 days.

In an embodiment, the device is a photovoltaic device a thermoelectric device, a magneto-electric device or a magneto-optic device. In an embodiment, the device is a photovoltaic device. In another embodiment, the device is a thermoelectric device. In a further embodiment, the device is a magneto-electric device. In another embodiment, the device is a magneto-optic device.

In an embodiment, the photovoltaic device is a solar cell or a semiconductor. In another embodiment, the device is a solar cell. In another embodiment, the thermoelectric device is a sensor or a heat transfer device.

In an embodiment, the device comprises:
a layer comprising an n-type material;
a layer comprising a p-type material; and
the semiconducting material is between the layer comprising the n-type material and the layer comprising the p-type material.

The term "n-type material" as used herein refers to a semiconducting material that has electrons as the majority current carriers. The n-type material can be any suitable n-type material. The term "p-type material" as used herein refers to a semiconducting material having holes as the majority current carriers. The p-type material can be any suitable p-type material.

In some embodiments, for example, wherein the device is a solar cell, the device further comprises a cathode that is coupled to the layer comprising the p-type material and an anode that is coupled to the layer comprising the n-type material. The cathode and anode can comprise any suitable charge conducting materials, the selection of which can be made by a person skilled in the art.

In an embodiment, the solar cell is a thin film solar cell. In another embodiment, the solar cell is a sensitized solar cell and the semiconducting material is coupled to a conducting mesoporous scaffold. The conducting mesoporous scaffold can comprise any suitable material. In some embodiments, the mesoporous scaffold comprises, consists essentially of or consists of $TiO_2$.

The following non-limiting examples are illustrative of the present application:

EXAMPLES

Example 1: Synthesis and Characterization of Cu(II)-Doped $Cs_2SbAgCl_6$ Double Perovskite: A Lead-Free, Low-Bandgap Material I. Experimental (a) Materials and Methods All starting precursor materials and solvents were obtained from commercial sources and used without further purification: CsCl (>99%, Acros Organics, NJ, USA), $Sb_2O_3$ (99%, Sigma Aldrich Co., St. Louis, Mo., USA), $AgNO_3$ (EM Science, NJ, USA), $CuCl_2.2H_2O$ (Aldrich Chemical Company, Inc, USA), HCl (EMD Chemical Inc., Darmstadt, Germany), $H_3PO_2$ (50 wt. % in $H_2O$, Sigma-Aldrich Co., St. Louis, Mo., USA). All reactions were performed under ambient conditions.

(b) Synthesis of Polycrystalline $Cs_2SbAgCl_6$

Freshly prepared AgCl was used in this synthesis. AgCl was formed by adding 10 M HCl (in excess) to an aqueous solution of $AgNO_3$, resulting in the precipitation of a white solid, which was filtered using a Buchner funnel, washed with 95% ethanol and dried under suction filtration. First, 4 mL of 10 M HCl and 1 mL of $H_3PO_2$ solvent were placed into a vial and heated to 120° C. using a hot plate with gentle stirring using a magnetic stir bar. Then 0.5 mmol of solid $Sb_2O_3$ (0.146 g) and 1 mmol of freshly prepared AgCl (0.143 g) were added to the hot solvent mixture, followed by the addition of 2 mmol of CsC (0.337 g); immediately, a pale-yellow precipitate was observed (later confirmed via PXRD and EDX to be $Cs_2SbAgCl_6$). The mixture was heated for one hour and then left at room temperature for two hours. The polycrystalline solid was filtered using a Buchner funnel and washed with 95% ethanol, followed by overnight drying. A small amount of $Cs_3Sb_2Cl_9$ can form as an impurity during the synthesis as shown in FIG. 1 (upper spectra).

(c) Synthesis of Polycrystalline $Cs_2Sb_{1-a}Ag_{1-b}Cu_{2x}Cl_6$ (a+b=2x, x=0.01, 0.05, and 0.10)

AgCl was prepared as described above in section I(b). For x=0.01: 0.034 g of $CuCl_2.2H_2O$ (0.20 mmol) was dissolved in 5 mL of 10 M HCl and a homogeneous solution was obtained. In a separate reaction, 10 mL of 10 M HCl was placed into a vial and heated to 120° C. with gentle stirring using a hot plate equipped with a magnetic stirrer. 1 mmol of white solid $Sb_2O_3$ powder (0.292 g) and 2 mmol of freshly prepared AgCl (0.287 g) were dissolved in the hot solvent mixture. Following dissolution, 4 mmol of CsCl (0.673 g) and 0.04 mmol (corresponding to 0.0068 g or 1 mL solution) of $CuCl_2.2H_2O$, prepared as described above, were added to the solution. A black precipitate was immediately observed. The mixture was heated for one hour and then left at room temperature for two hours. The polycrystalline solid was filtered using a Buchnerfunnel, washed with 95% ethanol, and followed by overnight drying. For x=0.05, 0.10: 10 mL of 10 M HCl was placed into a vial with gentle stirring and heated to 120° C. using a hot plate equipped with a magnetic stir bar. 0.95 mmol (0.277 g) or 0.90 mmol (0.262 g) of white solid $Sb_2O_3$ powder and 1.9 mmol (0.272 g) or 1.8 mmol (0.258 g) of freshly prepared AgCl, for x=0.05 and 0.10, respectively, were dissolved in the hot solvent mixture. Following dissolution, 4 mmol of CsCl (0.673 g) and 0.2 mmol (0.034 g) or 0.4 mmol (0.068 g) of $CuCl_2.2H_2O$, for x=0.05 and 0.10, respectively, were added to the solution. Immediately following this step, a black precipitate was observed. The mixture was heated for one hour and then allowed to stand at room temperature for two hours. The polycrystalline solid was filtered using a Buchner funnel, washed with 95% ethanol, and allowed to dry overnight.

(d) Diffuse Reflectance (DR) Spectroscopy

A Cary 5000 UV-Vis-NIR spectrophotometer, equipped for the analysis of small-quantity fine powdered samples, was used to obtain DR data (Analytical and Instrumental Laboratory, University of Alberta). Each sample was packed into a black boat (about 100 mg/sample) and each measurement was acquired between the wavelengths of 2500 and 200 nm.

The diffuse reflectance spectra were converted to pseudo-absorbance spectra using the following Kubelka-Munk transformation:

$$\alpha \sim \frac{(1-R)^2}{2R},$$

where, R=absolute reflectance and α=pseudo-absorbance. The direct and indirect bandgaps were measured by taking the intercept upon extrapolation of the linear regions of $(\alpha h\nu)^2$ vs E(eV) and $(\alpha h\nu)^{1/2}$ vs E(eV) plots, respectively.

(e) Powder X-Ray Diffraction (PXRD)

Powder X-ray diffraction (PXRD) measurements were collected on an Inel MPD multi-purpose diffractometer (40 kV, 50 mA) system (Department of Chemistry, University of Alberta) equipped with a CPS 120 curved position sensitive X-ray detector and Cu $K_\alpha$ radiation source (1.540596 Å). Samples were placed on a plastic sample holder and 26 data were collected from 0.290° to 113.767° with a step increment of 0.029°.

(f) Energy Dispersion X-Ray (EDX) Measurements

The energy dispersive X-ray (EDX) analysis was performed using a low vacuum JEOL JSM-6010LA InTouchScope (Scanning Electron Microscope Laboratory, University of Alberta), equipped with a Bruker Silicon Drift Detector.

(g) Inductively Coupled Plasma-Optical Emission Spectrometric (ICP-OES) Measurements The inductively coupled plasma-optical emission spectrometric (ICP-OES) analysis was performed using a Argon plasma ICP spectrophotometer Perkin Elmer Optima 2000 OES DV (Laboratorio di Microanalisi, University of Florence) instrument. The samples were dissolved in aqua regia.

(h) Thermogravimetric Analysis (TGA)

Thermogravimetric analysis was performed using a Perkin Elmer Pyris 1 instrument (Analytical and Instrumental Laboratory, University of Alberta) with a nitrogen gas flow of 20 mL/min and a heating rate of 5° C./min. The temperature range was 25-800° C.

(i) Humidity and Thermal Stress Tests

Figure 2:
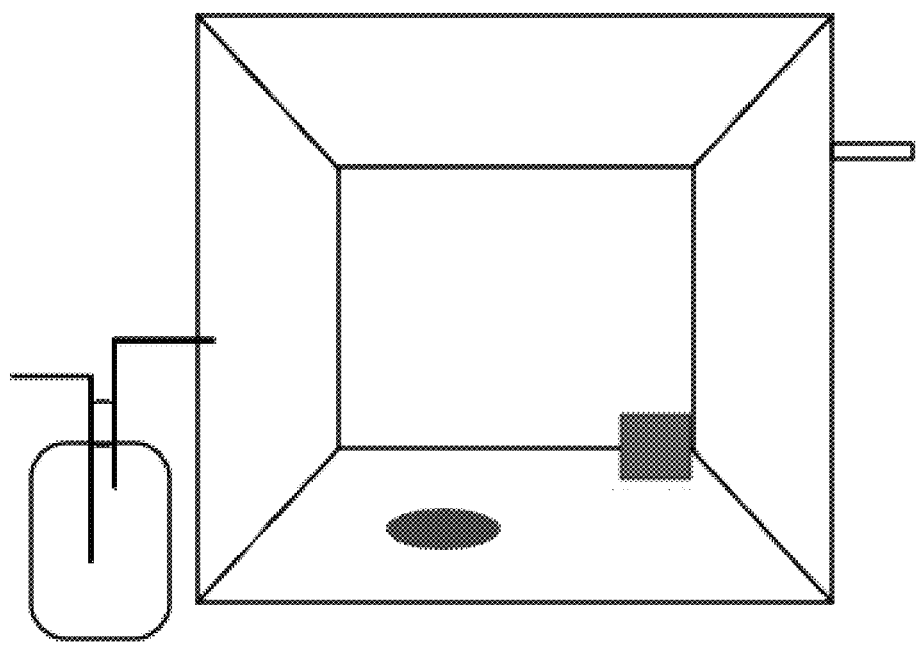
FIG. 2 is a schematic illustration of a custom-built humidifying chamber used in the examples of the present application, in which the circle in the chamber is a sample and the square is a humidity monitor.

A small amount of freshly prepared $Cs_2SbAgCl_6$ (x=0.00) and highest $Cu^{2+}$-doped (x=0.10) materials were placed in a custom-built humidifying chamber at 55±5% relative humidity at 295 K (FIG. 2). The samples were placed in a fume hood within this chamber in the presence of normal laboratory light (natural and artificial). After one year (x=0.00) or one month (x=0.10), the samples were removed from the humidifying chamber, and further analyses including, PXRD, $^{133}$Cs MAS NMR, and DR were collected.

A small amount of freshly prepared $Cs_2SbAgCl_6$ (x=0.00) and highest $Cu^{2+}$-doped (x=0.10) materials were placed in an oven at approximately 110° C. for six days, then removed and placed on the bench to cool to ambient temperature. Samples were then analyzed by PXRD, $^{133}$Cs MAS NMR spectroscopy and DR experiments to confirm purity and stability of the samples.

(j) Electron Paramagnetic Resonance (EPR) Spectroscopy

EPR spectra were acquired at X-band (9.77 GHz) on a Bruker ELEXSYS spectrometer (CERM, University of Florence), equipped with a standard ST4102 cavity. Field modulation was 20 G at 100 kHz and four scans were taken for each sample under ambient conditions. MW power was set to 50 mW; no evidence of saturation was observed.

(k) Solid-State Nuclear Magnetic Resonance (NMR) Spectroscopy $^{121}$Sb NMR: Antimony-121 NMR spectra were acquired at 7.05 T (300 MHz, $^1$H) and 11.75 T (500 MHz, $^1$H) on Bruker Avance 300 and 500 NMR spectrometers, respectively, using a non-selective Bloch pulse (short tip angle) or a selective (1.3 μs π/2, $\gamma B_1/2\pi$=65 kHz) Hahn-echo pulse sequence (($\pi/2)_x$-$\tau_1$-$(\pi)_y$-$\tau_2$-ACQ, where $\tau_1$ and $\tau_2$ represent the inter-pulse and refocusing delays, respectively), 1,000 to 29,000 co-added transients and a recycle delay of 2 s. Samples were packed in 4 mm OD $ZrO_2$ rotors (80 μL fill volume) and spectra were acquired under non-spinning and magic-angle spinning (MAS) conditions with a spinning frequency between 10 and 12 kHz. Additional $^{121}$Sb NMR spectra were acquired at 21.1 T (900 MHz, $^1$H) on a Bruker Avance II 900 NMR spectrometer using a 4 mm H/X MAS Bruker probe and a modified solid-echo pulse sequence (($\pi/2)_x$-$\tau_1$-$(\pi)_y$-$\tau_2$-ACQ)[28], $\gamma B_1/2\pi$=83 kHz (1.0 μs π/2), 1,024 co-added transients and a recycle delay of 2 s. All $^{121}$Sb NMR spectra were referenced by setting the peak for 0.5 M KSbF6 to δ=0.00 ppm.[29]

$^{133}$Cs NMR: Cesium-133 NMR spectra of the $Cs_2SbAgCl_6$ parent (x=0.00) and of the $Cu^{2+}$-doped (0.01, 0.05, and 0.10) materials were acquired at 11.75 T (500 MHz $^1$H) on a Bruker Avance 500 NMR spectrometer, with a Bloch pulse using a short pulse (1.25 μs, $\gamma B_1/2\pi$=50 kHz), 64 to 512 co-added transients and a recycle delay between 60 and 500 s. Samples were packed in 4 mm OD $ZrO_2$ rotors and spectra were collected under MAS conditions ($\omega r/2\pi$=13 kHz). Variable temperature NMR spectra were acquired at 238, 291, 323, and 343 K using appropriate relaxation delays (determined using a saturation recovery pulse sequence) to obtain pseudo-quantitative spectra (while not wishing to be limited by theory, some paramagnetic quenching is likely due to the presence of $Cu^{2+}$). The sample and probe temperature were permitted to stabilize for 10-15 minutes prior to each VT data point acquisition. The temperatures were calibrated with $^{207}$Pb NMR using $MAPbCl_3$.[30] Cesium-133 NMR spectra of $Cu^{2+}$ doped $Cs_2SbAgCl_6$ materials (x=0.01, 0.05, and 0.10) were acquired at 21.1 T (900 MHz $^1$H) on a Bruker Avance II 900 spectrometer using a 2.5 mm H/X MAS Bruker probe and a solid pulse (1.0 μs π/4 pulse) with 10 s recycle delays. Samples were packed in 2.5 mm OD $ZrO_2$ rotors and spectra were collected using a spinning frequency of 30 kHz. $^{133}$Cs 2D exchange spectroscopy (EXSY)[31] spectra were acquired at a spinning frequency of 30 kHz with π/2 pulses of 2.0 μs, recycle delays of 5 s, 96 to 128 co-added transients and 128 $t_1$ increments; mixing times ranged from 0.1 ms to 1 sec (FIG. 1, lower spectra). All $^{133}$Cs NMR spectra were referenced by setting the $^{133}$Cs peak of a 0.1 M CsCl solution to δ=0.00 ppm.

II. Results and Discussion

Figure 3:
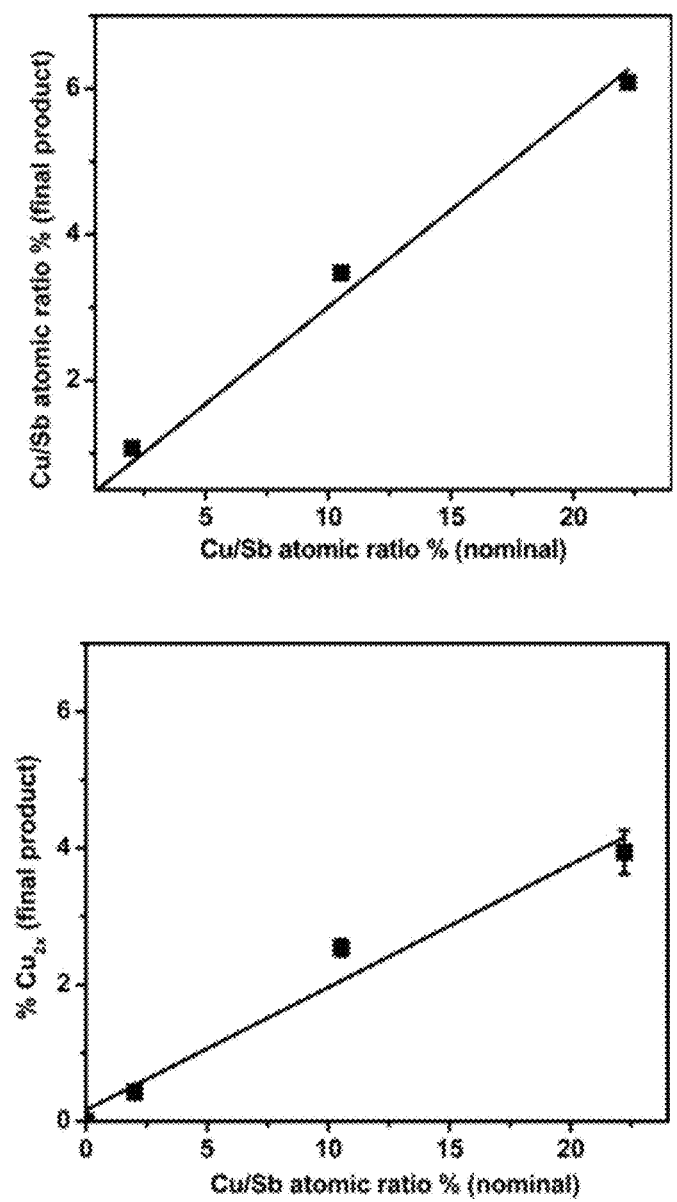
FIG. 3 shows plots showing the linear relation of Cu/Sb atomic ratio % before (nominal) and after (final product) the synthesis according to embodiments of the present application based on inductively coupled plasma-optical emission spectrometric (ICP-OES) data (upper plot) and Cu-composition based on $^{133}Cs$ magic angle spinning nuclear magnetic resonance spectra acquired at 11.75 T against nominal Cu/Sb atomic ratio % (lower plot).

The polycrystalline antimony-silver-based double perovskite, $Cs_2SbAgCl_6$, was doped with $Cu^{2+}$ by synthetic loading via solvent synthesis to produce $Cs_2Sb_{1-a}Ag_{1-b}Cu_{2x}Cl_6$ (wherein a+b=2x, x=0.00 (i.e., parent compound), 0.01, 0.05, and 0.10). The nominal composition is reported due to the low Cu concentrations and associated challenges in elemental analysis of these materials (Table 1). Uncertainties in Table 1 are provided in the parentheses, as the dopant concentrations are near the detection limits, hence the larger uncertainties. FIG. 3 shows a nearly linear relationship between quantitatively measured Cu concentrations and the Cu/Sb atomic ratio by synthetic loading (nominal composition). Due to the low Cu concentrations and associated challenges in elemental analysis of these materials, in the present application, all Cu-doped materials are referred to via their nominal composition, x.

TABLE 1

Nominal and elemental analyzed results (EDX, ICP-OES and $^{133}$Cs NMR) for $Cs_2SbAgCl_6$ (x = 0.00) and for the $Cu^{2+}$-doped (x = 0.01, 0.05, 0.10) materials.

| | Atom % by EDX[b] | | | | | Cu Composition | | | | |
| | | | | | | Nominal (atomic ratio %) | | ICP-OES[c] (atomic ratio %) | | $^{133}$Cs NMR % $Cu_{2x}$[d] |
| x[a] | Cs | Sb | Ag | Cl | Cu | Cu/Cs | Cu/Sb | Cu/Cs | Cu/Sb | (±0.5) |
|---|---|---|---|---|---|---|---|---|---|---|
| 0.00 | 21.64 (0.93) | 11.24 (0.63) | 9.72 (0.74) | 57.40 (0.90) | — | — | — | — | — | — |
| 0.010 | 21.04 (0.42) | 11.07 (0.54) | 10.31 (0.14) | 56.84 (1.05) | 0.74 (0.46) | 1.00 | 2.00 | 0.55 | 1.07 | 0.43 |
| 0.050 | 21.84 (0.74) | 11.12 (0.47) | 8.78 (0.72) | 57.18 (0.78) | 1.08 (0.69) | 5.00 | 10.53 | 1.52 | 3.48 | 2.54 |
| 0.100 | 22.12 (0.71) | 11.19 (0.60) | 6.80 (0.51) | 58.33 (1.20) | 1.55 (0.94) | 10.00 | 22.22 | 2.53 | 6.09 | 3.94 |

[a]x is the nominal $Cu^{2+}$ composition in $Cs_2Sb_{1-a}Ag_{1-b}Cu_{2x}Cl_6$.
[b]EDX is energy-dispersive X-ray spectroscopic analysis (in quintuplicate).
[c]ICP-OES is inductively coupled plasma-optical emission spectrometric analysis (in triplicate).
[d]$Cu_{2x}$ is % $Cu^{2+}$ concentration in the final product of $Cs_2Sb_{1-a}Ag_{1-b}Cu_{2x}Cl_6$ from $^{133}$Cs NMR.

Figure 4:
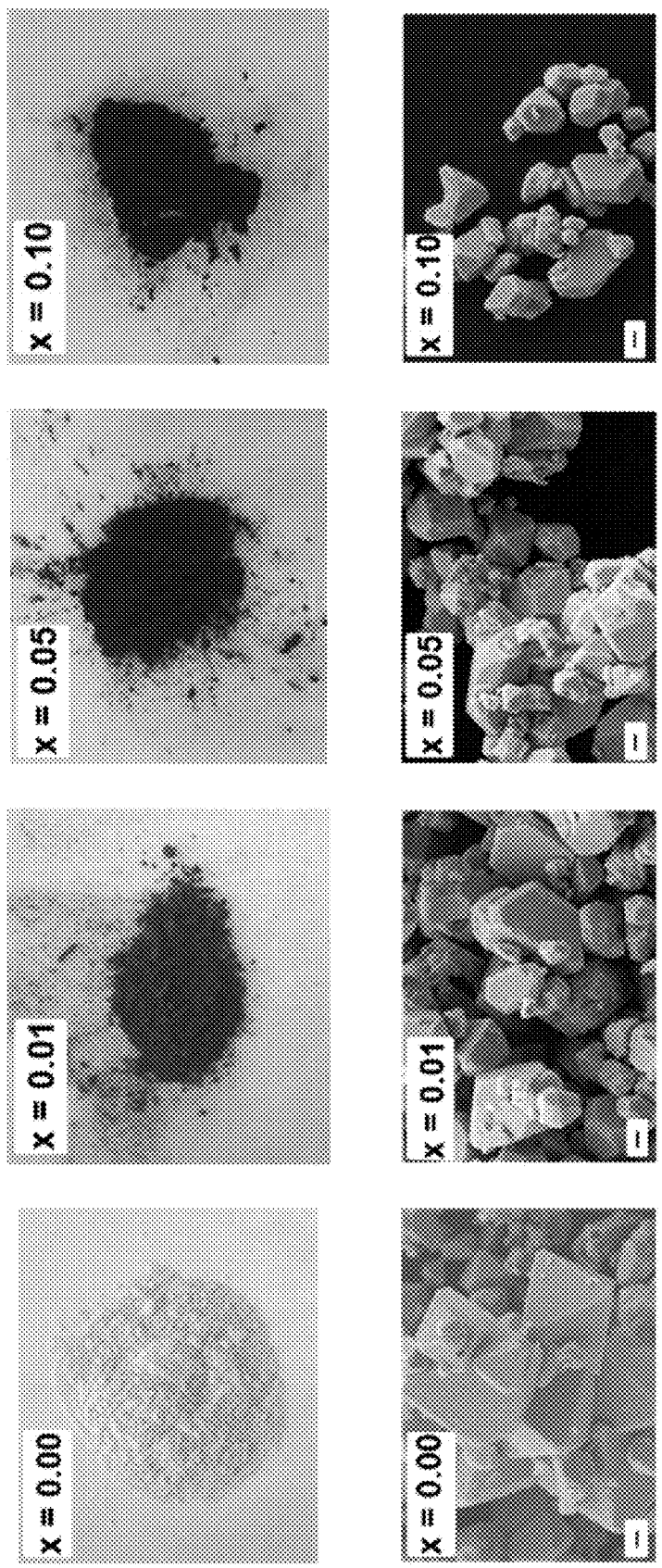
FIG. 4 shows exemplary photographs (upper images) and field emission scanning electron microscopy (FESEM; lower images) of $Cs_2SbAgCl_6$ (i.e., x=0.00; far left images) and $Cu^{2+}$-doped polycrystalline materials according to embodiments of the present application wherein x is 0.01 (second from left images), 0.05 (second from right images) and 0.10 (far right images). The x values indicate nominal $Cu^{2+}$ loading. The scale bar at the lower left of the FESEM images is 2 μm.
Figure 5:
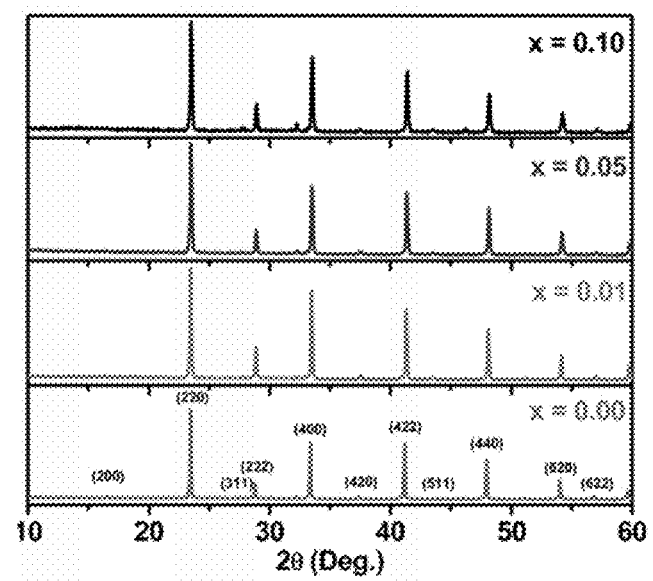
FIG. 5 shows powder XRD patterns for $Cs_2SbAgCl_6$ (x=0.00) and for $Cu^{2+}$-doped $Cs_2SbAgCl_6$ materials according to embodiments of the present application (upper image) as well as an enlargement of powder XRD patterns for $Cs_2SbAgCl_6$ (x=0.00) and for $Cu^{2+}$-doped $Cs_2SbAgCl_6$ materials according to embodiments of the present application (lower image).
Figure 5:
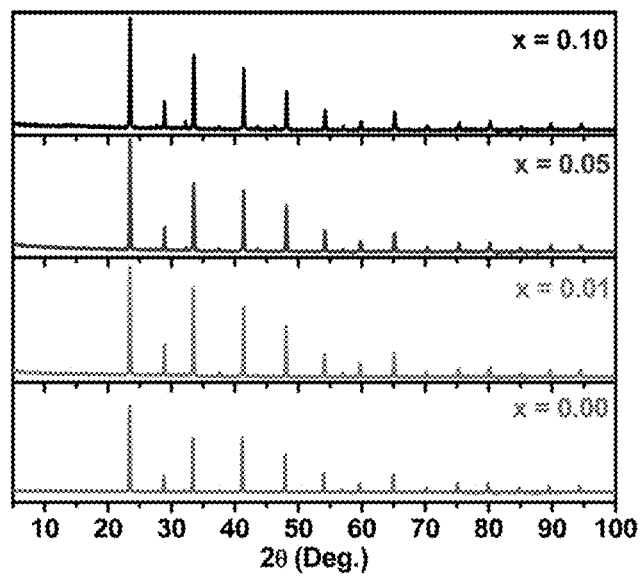

FIG. 4 shows photographs and the corresponding FESEM images for the $Cs_2SbAgCl_6$ parent and the $Cu^{2+}$-doped materials. The FESEM images confirm that the materials are composed of multifaced micrometer-sized polycrystals. The PXRD pattern (FIG. 5) of $Cs_2SbAgCl_6$, indicates a face-centered cubic double perovskite structure (Fm3⁻m space group) with a=b=c=10.699 Å unit cell dimensions. The nearly identical PXRD patterns for $Cs_2SbAgCl_6$ and the doped materials indicate single-phase crystalline solids.

Figure 6:
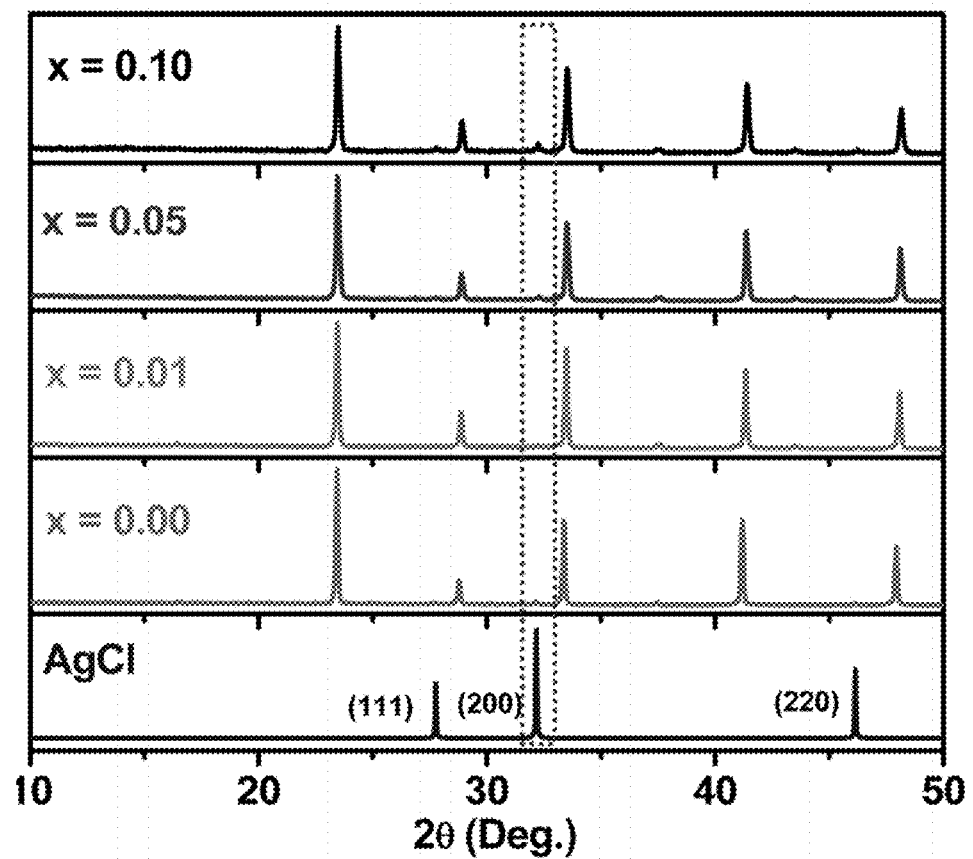
FIG. 6 shows powder XRD patterns for AgCl, $Cs_2SbAgCl_6$ and for $Cs_2SbAgCl_6$ with the indicated level (x=0.01, 0.05 and 0.10) of nominal $Cu^{2+}$ doping according to embodiments of the present application. The presence of AgCl in the double perovskite materials is indicated, with the relative intensity of the AgCl (200) peak increasing as the $Cu^{2+}$ doping increases (dotted box).

Closer examination of the PXRD patterns (FIG. 6) indicates trace quantities of AgCl in the parent material, with increasing AgCl concentration as Cu is incorporated into the sample. In FIG. 6, the PXRD pattern for AgCl is simulated.[32] Qualitatively, while not wishing to be limited by theory, these findings may suggest that $[AgCl_6]^{5-}$ octahedra in the $Cs_2SbAgCl_6$ double perovskite lattice are being replaced with $[CuCl_6]^{4-}$ octahedra upon $Cu^{2+}$ doping, forming vacancies to maintain charge balance and causing the formation of insoluble AgCl. The elemental analysis of these materials using EDX spectroscopy (Table 1) provides a clearer interpretation, indicating a decrease in $Ag^+$ concentration with increasing $Cu^{2+}$ doping, while the concentrations of $Cs^+$, $Sb^{3+}$, and $Cl^-$ are, within experimental uncertainty, unchanged. Note that the initial $Sb^{3+}$:$Ag^+$ loading ratios are kept constant at the beginning of the synthesis for all samples.

Figure 7:
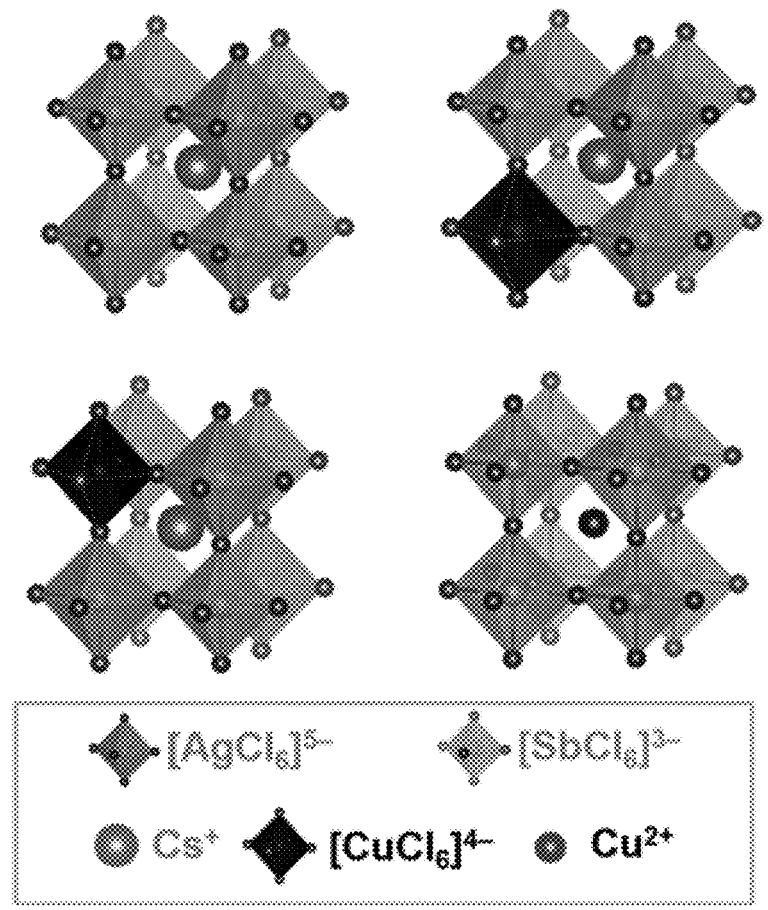
FIG. 7 shows a schematic representation of the $Cs_2SbAgCl_6$ double perovskite structure (upper left) and of possible $Cu^{2+}$-doped analogues where $[CuCl_6]^{4-}$ replaces $[AgCl_6]^{5-}$ (upper right) or $[SbCl_6]^{3-}$ (lower left) or where $Cu^{2+}$ replaces $Cs^+$ (lower right), leading to a formation of a neighboring vacancy.

FIG. 7 displays the crystal structure of the $Cs_2SbAgCl_6$ double perovskite, showing that $[SbCl]^{3-}$ and $[AgCl]^{5-}$ octahedra are coordinated to each other in alternating corner-sharing configurations with a $Cs^+$ ion residing at the center of the cuboctahedra, thus maintaining an extended 3D perovskite crystal structure. There are, in principle, three positions in which $Cu^{2+}$ can be incorporated into a double perovskite crystal lattice: the $[AgCl_6]^{5-}$ or the $[SbCl_6]^{3-}$ octahedra may be replaced with $[CuCl_6]^{4-}$ (FIG. 7, upper right or lower left, respectively), or $Cu^{2+}$ may occupy an A-site of the lattice (FIG. 7, lower right), leading to the formation of a neighboring vacancy. Because of the large difference in the Pauling electronegativity ($\chi_P$) of Cs (0.79) compared to that of Cu (1.90), a structure that includes six covalent Cu—Cl bonds rather than 12 Cu—Cl ionic interactions is favored. Additionally, since $\chi_P$ for Ag (1.93) is very close to that for Cu but significantly different from that for Sb (2.05), the $[CuCl]^{4-}$ octahedra in the doped material are expected to primarily replace the $[AgCl_6]^{5-}$ octahedra, as illustrated in FIG. 7, upper right. In summary, while not wishing to be limited by theory, substitution of $Ag^+$ by $Cu^{2+}$ produces a $Ag^+$ cationic vacancy to maintain charge balance neutrality of the doped materials. The EPR spectra (vide infra) of the sample at the lowest copper loading are consistent with the presence of tetragonally distorted $[CuCl_6]^{4-}$ octahedra:[33] the spectrum is substantially axial, with the downfield $g_\perp$ feature, about 2.3, sizably broadened by unresolved hyperfine couplings and with the gi component, about 2.0, shifted slightly upfield with respect to literature values. With increased doping, a peak at about 2.15 appears, indicating the presence of exchange-coupled copper pairs.[34] While not wishing to be limited by theory, this observation suggests that copper-copper pairs form with a higher than statistical probability. Exchange coupling is expected to emerge because of the interaction of the electrons on one copper center with electrons on another copper center, through the orbitals of intervening nonmagnetic atoms between them.[34] This can happen through two bonds, as it would be for a Cu—Cl—Cu arrangement as well as through four bonds, as it would be for a Cu—Cl-M-Cl—Cu arrangement. While not wishing to be limited by theory, an explanation for the observed EPR spectrum is the formation of Cu—Cl—Cu pairs in the form of two elongated octahedra that share a vertex and have orthogonal elongation axes. The emergence of such Cu—Cu pairs if the substitution was random would be expected around 6%, 30%, and 60% for x=0.01, 0.05, and 0.1 $Cu^{2+}$-doped materials, respectively, including triplets and quartets.

Figure 8:
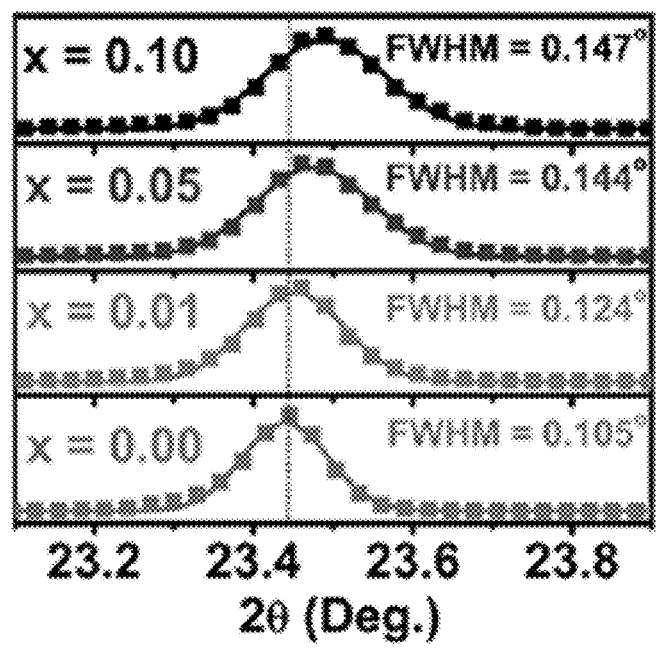
FIG. 8 shows an expansion of the highly intense (220) peak in the powder XRD patterns (upper plot), illustrating its shift toward higher 2θ values and its broadening as the $Cu^{2+}$ content increases from x=0.00 to 0.10 according to embodiments of the present application. The dotted line is a guide for the eye.
Figure 8:
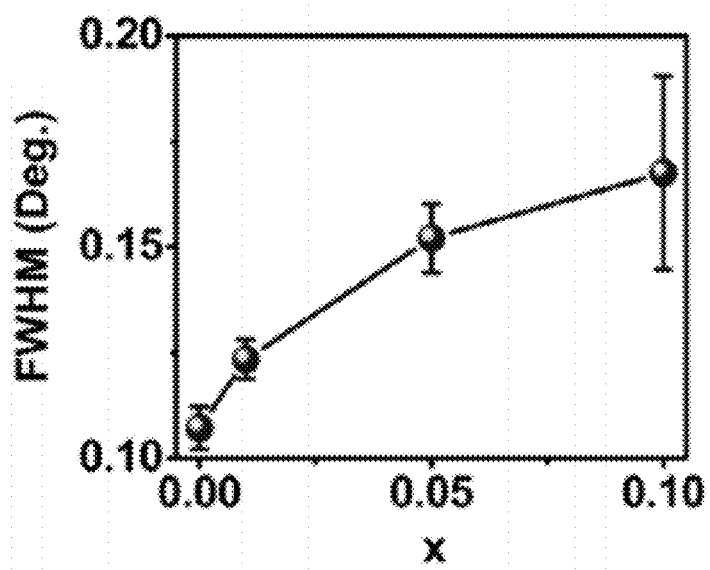

The ionic radius for $Cu^{2+}$ (0.87 Å) is slightly less than that for $Sb^{3+}$ (0.90 Å) and significantly less than that for $Ag^+$ (1.29 Å);[35] thus, a decrease in the lattice parameter due to the incorporation of $Cu^{2+}$ into the crystal lattice is expected. For example, FIG. 8 (upper plot) shows that the highly intense (220) peak in the PXRD pattern shifts slightly toward a higher 2θ value with copper incorporation, suggesting that the average lattice parameters are decreasing for the doped materials and that the $Cu^{2+}$ ion has substituted into the lattice. The full width at half-maximum (FWHM) of the diffraction peaks also increases systematically with increasing dopant concentration. While not wishing to be limited by theory, these results imply local nonuniform microstrain structural defects in our doped materials (see below).[36] Such defects have also been observed in heterovalent $Bi^{3+}$ doping of the $MAPbBr_3$ perovskite.[37] The extent of microstrain has been computed by measuring the FWHM values of the PXRD peaks in the present materials with and without $Cu^{2+}$ doping. The steadily increasing FWHM values (FIG. 8, lower plot) are consistent with increased $Cu^{2+}$ incorporation into the crystal lattice.

Figure 9:
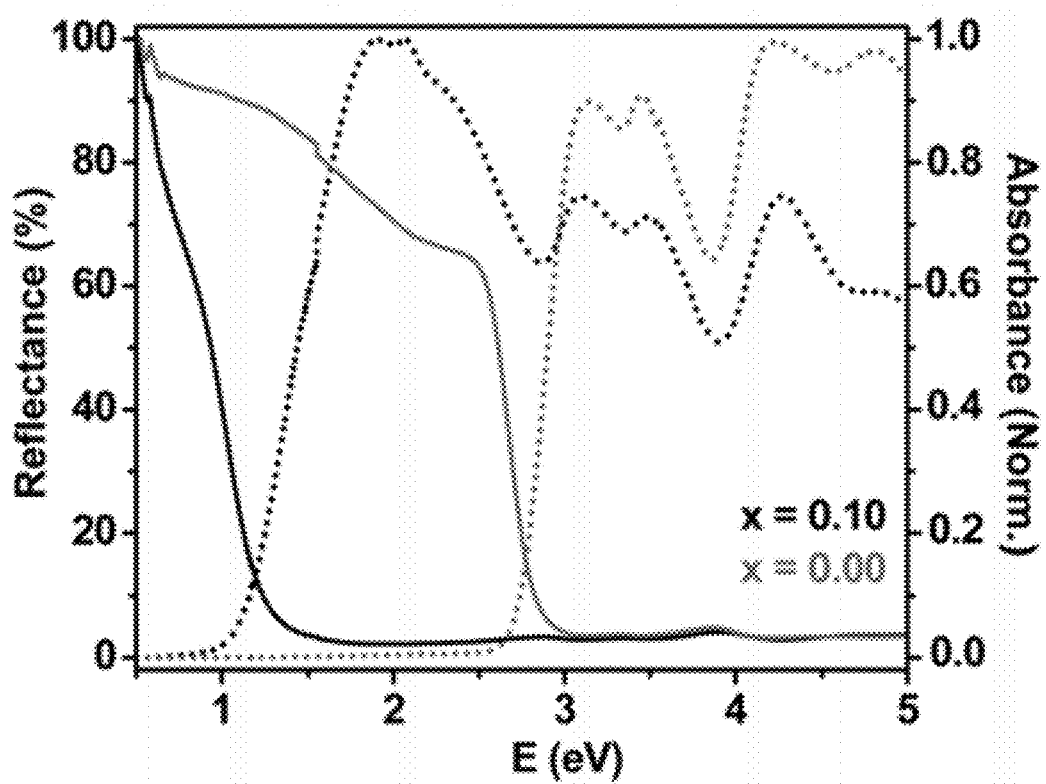
FIG. 9 shows an ultraviolet-visible-near infrared (UV—VIS-NIR) diffuse reflectance (DR) (solid lines) and normalized absorption (dotted lines) spectrum for $Cs_2SbAgCl_6$ parent (i.e., x=0.00) and the maximum $Cu^{2+}$-doped (x=0.10) according to an embodiment of the present application materials.
Figure 10:
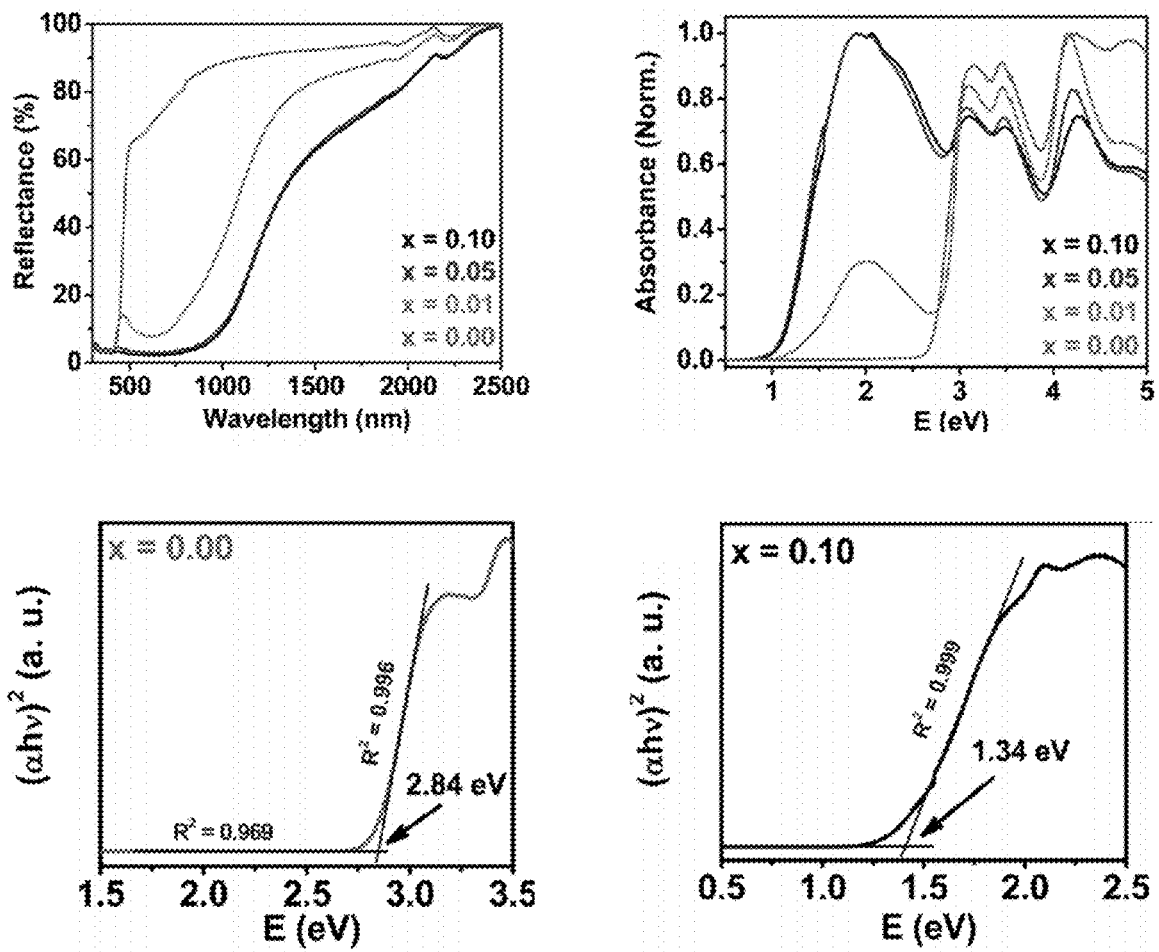
FIG. 10 shows UV—VIS-NIR DR (upper left image), and normalized absorption (upper right image) spectrum for $Cs_2SbAgCl_6$ parent (i.e. x=0.00) and all $Cu^{2+}$-doped (x=0.01, 0.05, and 0.10) materials according to embodiments of the present application. The DR spectra is converted to absorbance by using the Kubelka-Munk equation.
Figure 11:
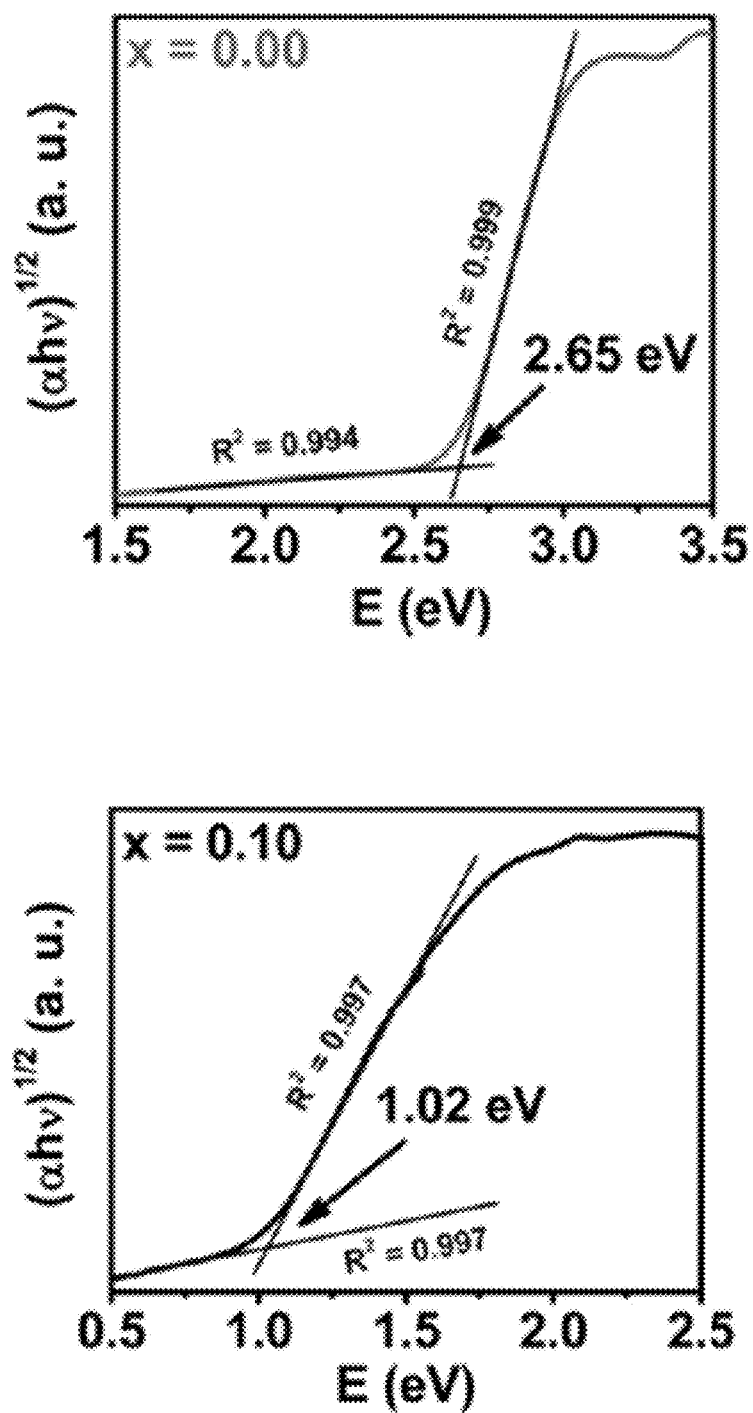
FIG. 11 shows Tauc plots showing indirect bandgaps of 2.65 eV for $Cs_2SbAgCl_6$ (x=0.00; upper image) and 1.02 eV for the maximum $Cu^{2+}$-doped material according to embodiments of the present application (x=0.10; lower image). DR spectra were converted to absorbance by using the Kubelka-Munk equation.

$Cs_2SbAgCl_6$ shows characteristics of a material with an indirect bandgap.[14(b),15] FIG. 9 shows the DR and normalized absorbance spectrum of the $Cs_2SbAgCl_6$ parent and of the $Cu^{2+}$-doped (x=0.10) double perovskites (see FIG. 10 for the complete set of the series), which indicate a dramatic shift of the optical band edge upon $Cu^{2+}$ doping. The Tauc plots (FIG. 11) show that $Cu^{2+}$ doping (x=0.10) reduces the indirect bandgap from 2.65 eV for $Cs_2SbAgCl_6$ to 1.02 eV. Assuming a direct allowed transition, Tauc plots give bandgaps of 2.84 eV for $Cs_2SbAgCl_6$ and 1.34 eV for the $Cu^{2+}$-doped material (x=0.10) (FIG. 10). This finding is consistent with the pictures shown in FIG. 4, upper images, where a drastic visual color change from yellow (in color images) to black occurs upon $Cu^{2+}$ doping, further supporting the conclusion of a reduced bandgap, absorbing in the near-IR range. The band edge is not sharp for the doped materials compared to that for $Cs_2SbAgCl_6$. While not wishing to be limited by theory, this result suggests lattice disorder/defects in the doped materials and is consistent with the NMR results, discussed below. Band tailing is also observed in layered halide double perovskites,[17] thin film hybrid lead mixed-halide (Br, I) perovskite films,[38] and doped lead halide perovskites.[9,37] Volonakis et al.[39] showed that the calculated indirect bandgaps are 2.6 and 2.1 eV for $Cs_2SbAgCl_6$ and $Cs_2SbCuCl_6$, respectively. While not wishing to be limited by theory, the difference between the experimental determined bandgap of the present $Cu^{2+}$-doped materials (vs calculated $Cs_2SbCuCl_6$, diamagnetic $3d^{10}$ Cu(I)) is attributed to the oxidation state; paramagnetic $3d^9$ Cu(II) enters the double perovskite lattice in the materials presented herein.

Low doping concentrations of $Cu^{2+}$ in $Cs_2SbAgCl_6$ double perovskite would cause a localized state near the band edges, which would be responsible for a localized transition. As the dopant $Cu^{2+}$ concentration increases within the lattice, the average Cu—Cu distances between defect sites will decrease dramatically throughout the lattice. These localized impurity states will then form a delocalized state, resulting in an overall narrowing of the bandgap in higher doped materials. The experimental EPR results (above) show $Cu^{2+}$—$Cu^{2+}$ coupling at higher $Cu^{2+}$ doping concentrations in $Cs_2SbAgCl_6$, while not wishing to be limited by theory, supporting the possibility of forming a delocalized state due to suitable Cu—Cu distances.

The PXRD and DR results indicate local structural disorder within the doped double perovskites. Solid-state nuclear magnetic resonance (NMR) spectroscopy is a powerful analytical tool that allows one to characterize atomic-level short- and medium-range structure, as well as dynamics in hybrid perovskites.[5(c),40] Accordingly, to further elucidate these finer structural details, NMR spectroscopy, a nondestructive analytical technique, was used to further decode the short- and medium-range structure of the A ($^{133}$Cs) and B ($^{121}$Sb) sites.

Figure 12:
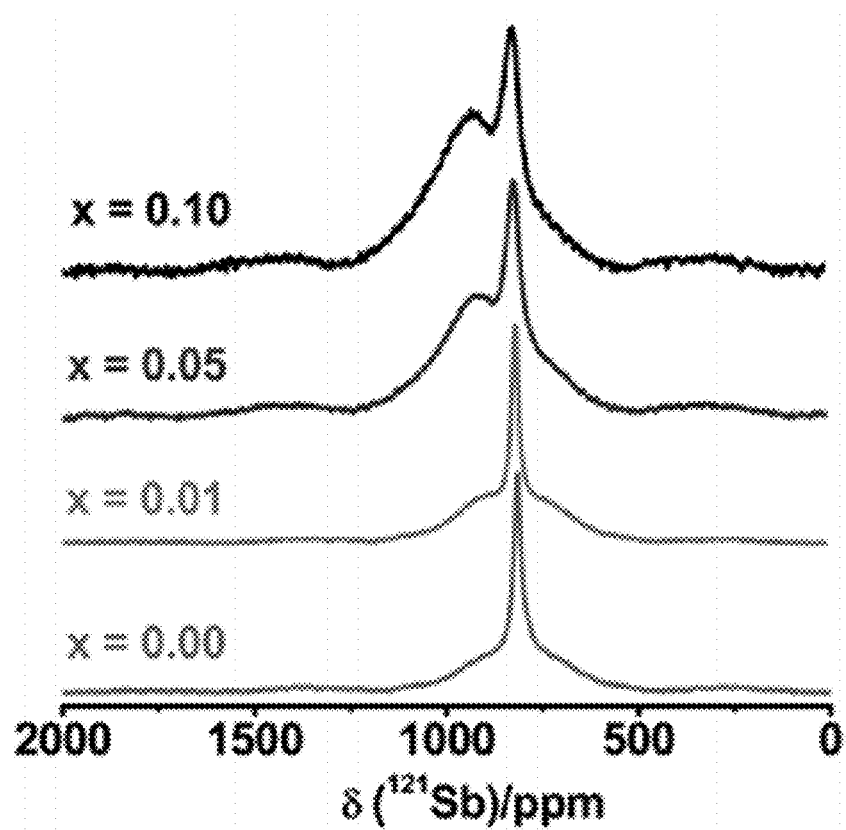
FIG. 12 shows solid-state $^{121}Sb$ NMR spectra for $Cs_2SbAgCl_6$ materials with $Cu^{2+}$ doping of, from top to bottom, x=0.10, 0.05 and 0.01 according to embodiments of the present application in comparison to the parent $Cs_2SbAgCl_6$ (x=0). The spectra were acquired for nonspinning samples at 21.1 T and were acquired using a selective 90° pulse to emphasize the higher frequency resonance that is subject to a sizable quadrupole coupling constant.
Figure 13:
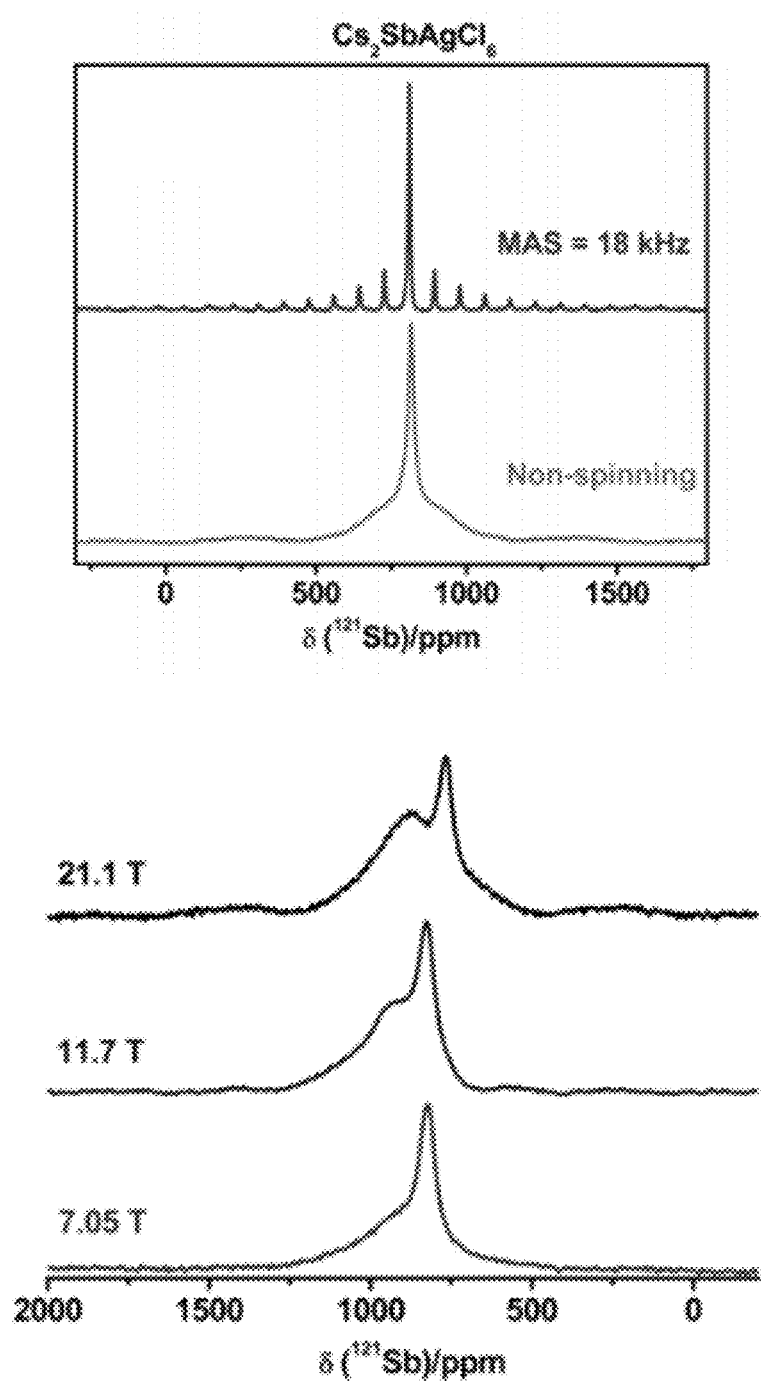
FIG. 13 shows a comparison of $^{121}Sb$ NMR spectra of $Cs_2SbAgCl_6$ parent under non-spinning and magic-angle spinning (18 kHz) conditions at 21.1 T (upper image) as well as a comparison of $^{121}Sb$ NMR spectra acquired at 7.05, 11.75, and 21.1 T for non-spinning $Cs_2SbAgCl_6$ with $Cu^{2+}$ doping of x=0.10 according to an embodiment of the present application (lower image), showing the improved Sb site resolution with increasing magnetic field strength. Data were acquired with a selective central transition pulse, optimized for the larger CQ resonance to higher frequency (i.e. for the peak centred at about 900 ppm).

FIG. 12 shows the $^{121}$Sb NMR spectrum for nonspinning $Cs_2SbAgCl_6$ (x=0.00) acquired at 21.1 T, displaying a sharp central transition resonance, centered at 817 ppm. Because $Cs_2SbAgCl_6$ has cubic symmetry and the Sb chemical environment has octahedral coordination to six $Cl^-$ anions and the six next-nearest $Ag^+$ cations, second-order quadrupolar broadening is not expected. Nevertheless, a broad underlying component spanning from about 1150 to 500 ppm was detected, which breaks into a series of spinning sidebands when spun at the magic angle. While not wishing to be limited by theory, this was attributed to signals from the satellite transitions for crystallites exhibiting slight imperfections/defects. Fitting both nonspinning and magic-angle spinning data obtained at two magnetic field strengths ($B_o$=11.75 and 21.1 T) enables the determination of a small $^{121}$Sb quadrupole coupling constant ($C_Q$) of 1.1±0.3 MHz for the $Cs_2SbAgCl_6$ parent double perovskite (FIG. 13, upper plot). This is consistent with other cubic antimony-containing complexes where even slight distortions about the symmetric $Sb^{3+}$ nucleus can give rise to considerable quadrupole coupling constants with visible second-order broadening (e.g., $C_Q$=2-3 MHz for $K_2SbF_6$), a consequence of the sizable $^{121}$Sb quadrupole moment (−36.0 $fm^2$).[41]

Figure 14:
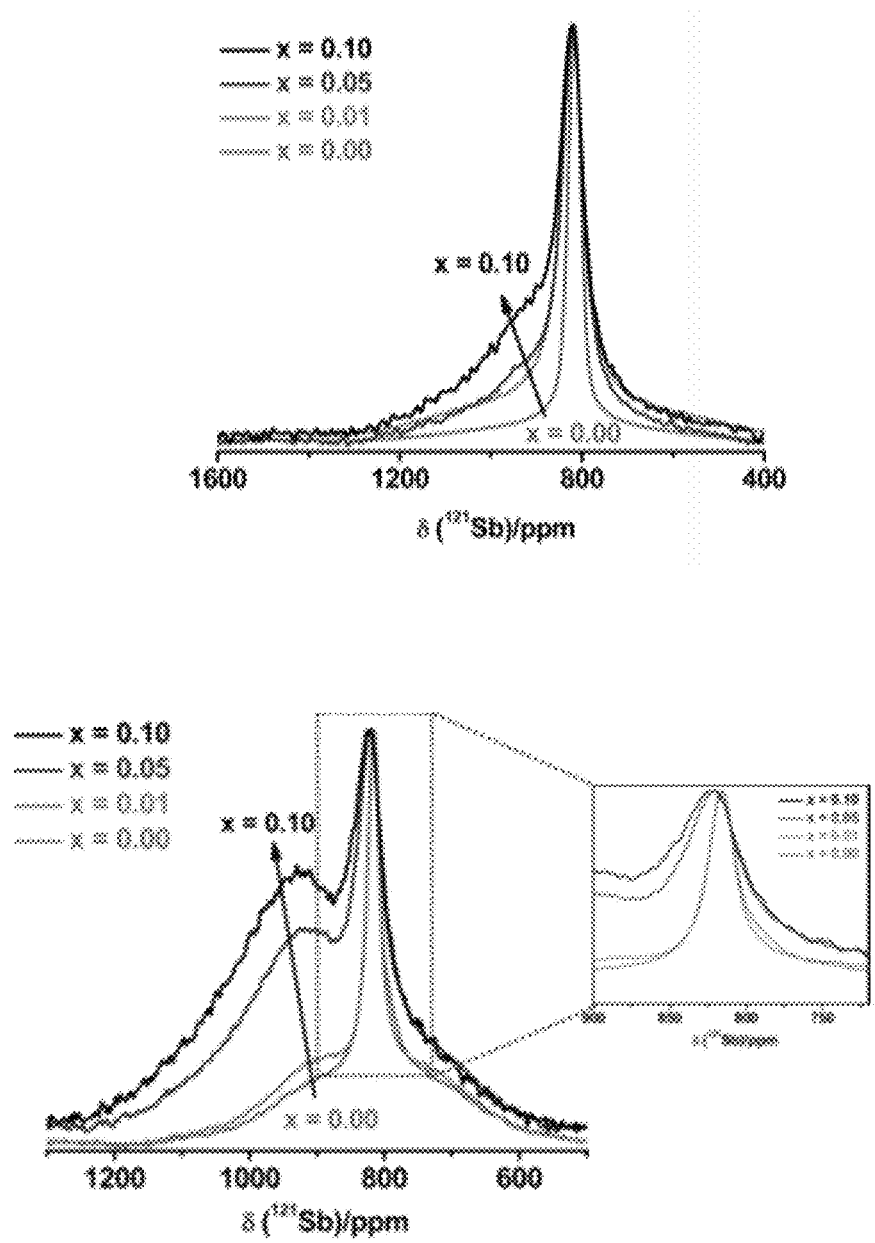
FIG. 14 shows a comparison of $^{121}Sb$ NMR spectra acquired at 7.05 T (upper image) and 21.1 T (lower image) for non-spinning $Cs_2SbAgCl_6$ (x=0.00) and for this material with $Cu^{2+}$ doping (x=0.01, 0.05, and 0.10) according to embodiments of the present application, showing both the intensity of the high-frequency peak (δ about 900 ppm) and illustrating that the linewidth of the parent peak (i.e. the low frequency peak) increases with $Cu^{2+}$ doping (insert).

Upon $Cu^{2+}$ incorporation, a second broad $^{121}$Sb NMR resonance appears to high frequency of the sharp resonance (FIG. 13, upper image). While not wishing to be limited by theory, the breadth of the peak was attributed to the change in the electric field gradient about the $[SbCl_6]^{3-}$ octahedra that occur when neighboring $Ag^+$ cations are replaced with $Cu^{2+}$, that is, $[(SbCl_6)Ag_5Cu]$, resulting in a sizable quadrupole coupling (FIG. 13, lower image). Also, a systematic increase in the area of the peak centered at about 900 ppm was observed (FIG. 14). Because of the differences in quadrupole coupling constants between the two sites, the two resonances were not quantitatively fitted, although qualitatively the broad resonance increased with $Cu^{2+}$ doping. Closer examination of the central transition assigned to $[(SbCl_6)Ag_6]$ indicates that this NMR site was also impacted by $Cu^{2+}$ incorporation, with the FWHM of the peak at $\delta_{iso}$=817 ppm increasing from 2.8±0.3 kHz (x=0.00) to 7.5±0.5 kHz (x=0.10) (FIG. 14). While not wishing to be limited by theory, the broadening was attributed to a reduction of the medium-range cubic symmetry about $Sb^{3+}$ as $Cu^{2+}$ was incorporated into the cubic lattice, impacting the electric field gradient about Sb, and to the presence of a paramagnetic species ($Cu^{2+}$, $d^9$ system), which reduces the spin-lattice relaxation times ($T_1$) of $^{133}$Cs and increases the NMR line widths under magic-angle spinning ($T_2$*) for $^{133}$Cs and $^{121}$Sb NMR (Table 2). The $^{121}$Sb Gaussian-like line shape of the $Cs_2SbAgCl_6$ parent double perovskite is commonly observed in hybrid perovskites and while not wishing to be limited by theory, was attributed to indirect spin-spin coupling (J-coupling) between $^{121}$Sb and the six-coordinated $^{35/37}$Cl anions.[41]

TABLE 2

$^{133}$Cs and $^{121}$Sb NMR relaxation parameters ($T_1$ and $T_2$*) for $Cs_2SbAgCl_6$ (x = 0.00) and for the x = 0.10 $Cu^{2+}$-doped materials.

| x | $^{133}$Cs ($T_1$), sec | $^{133}$Cs ($T_2$*), ms | $^{121}$Sb ($T_2$*), μs |
|---|---|---|---|
| 0 | 51 ± 6 | 6 ± 1 | 360 ± 40 |
| 0.10 | 2.7 ± 0.5 | 1.3 ± 0.1 | 130 ± 30 |

All $^{133}$Cs NMR relaxation parameters ($T_1$ and $T_2$*) were measured at 11.75 T and whereas all $^{121}$Sb NMR relaxation parameters ($T_2$*) were measured at 7.05 T.

Figure 15:
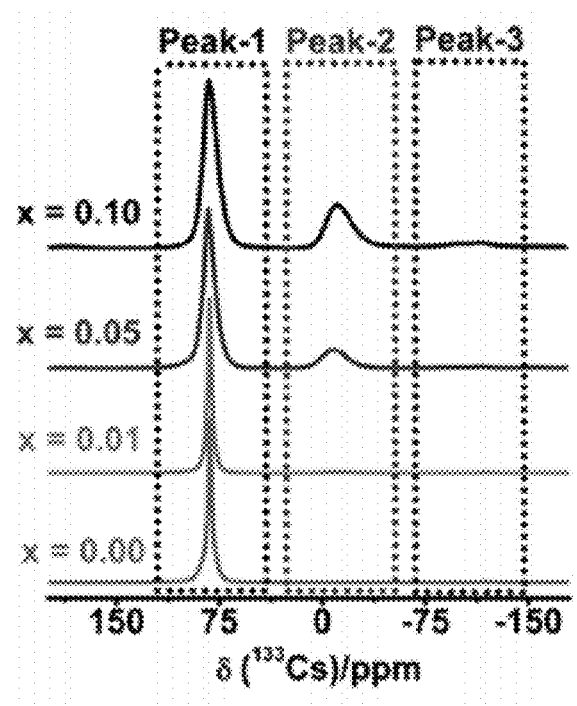
FIG. 15 shows solid-state $^{133}Cs$ NMR spectra for $Cs_2SbAgCl_6$ materials with $Cu^{2+}$ doping of, from top to bottom, x=0.10, 0.05 and 0.01 according to embodiments of the present application in comparison to the parent $Cs_2SbAgCl_6$ (x=0). The spectra were acquired at 11.75 T at a spinning frequency of 13.0 kHz.
Figure 16:
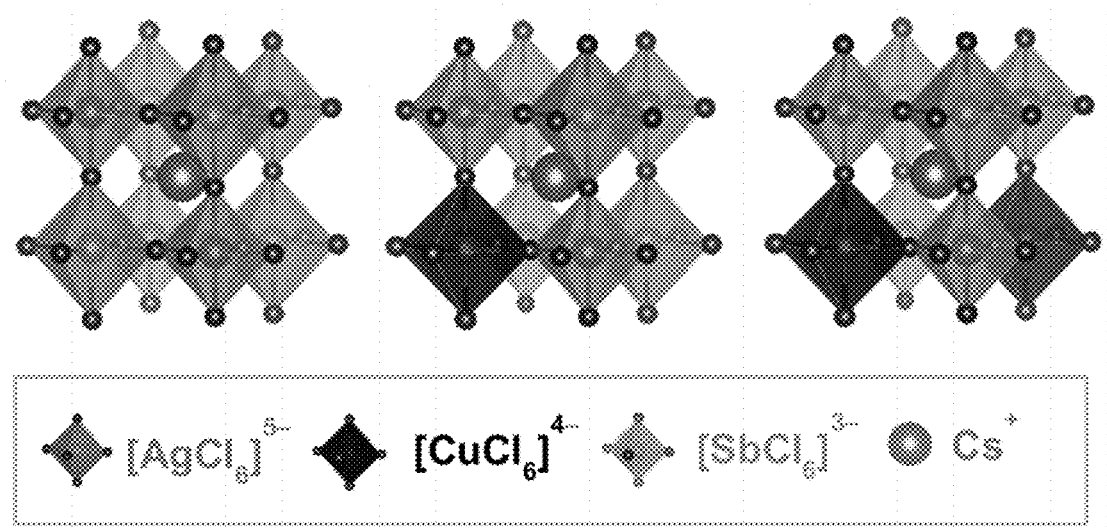
FIG. 16 shows a schematic representation of $Cs_2SbAgCl_6$ double perovskites without (left image), and with $Cu^{2+}$ doping at one (center image) or two (right image) sites according to embodiments of the present application. This representation assumes that $[CuCl_6]^{4-}$ will generally only substitute $[AgCl_6]^{5-}$ sites.

FIG. 15 shows the $^{133}$Cs MAS NMR spectra of $Cs_2SbAgCl_6$ with and without $Cu^{2+}$ doping. The small quadrupole moment for $^{133}$Cs, Q=−0.34 $fm^2$ and high nuclear spin, I=7/2, combined with its 100% natural abundance, make it an attractive NMR nucleus that behaves as a pseudo I=½ nuclear spin.[42] Because $Cs^+$ resides in a cubooctahedral void surrounded by alternating $[SbCl_6]^{3-}$ and $[AgCl_6]^{5-}$ octahedra (FIG. 7, upper left), it is a useful method to probe local structural defects within the $Cs_2SbAgCl_6$ lattice as there is only one crystallographic position for this nucleus. A peak at $\delta_{iso}$=82 ppm in the $^{133}$Cs MAS NMR spectra (labeled Peak-1 in FIG. 15) was observed for all samples. A new resonance emerged at $\delta_{iso}$=−10 ppm (Peak-2), as $Cu^{2+}$ was incorporated. While not wishing to be limited by theory, because $Cu^{2+}$ is expected to substitute Ag+, this peak was tentatively assigned to a $Cs^+$ surrounded by four $Sb^{3+}$, three Ag+, and one $Cu^{2+}$ (FIG. 7, upper right and FIG. 16, middle schematic). As the $Cu^{2+}$ doping increases further (x≥0.05), a third resonance begins to emerge at $\delta^{iso}$=−100 ppm (FIG. 15, Peak-3) albeit with very low intensity (<3% at x=0.10, Table 3), which, while not wishing to be limited by theory, was assigned to $^{133}$Cs nuclei proximate to two $Cu^{2+}$ sites (FIG. 16, right hand schematic). From the crystal structure of $Cs_2SbAgCl_6$, the $Cs^+$ ion resides in the cubooctahedral void, surrounded by a total of eight (four $Ag^+$ and four $Sb^{3+}$) octahedral sites (FIG. 16, left hand schematic). Similarly, each $Ag^+$ or $Sb^{3+}$ site is also surrounded by eight $Cs^+$ ions. Since the peaks labeled Peak-2 in the $^{133}$Cs NMR spectra arise from $Cu^{2+}$ substitution in a $Ag^+$ site, each $Cu^{2+}$ ion is surrounded by eight $Cs^+$ ions. If one neglects the minor contribution giving rise to Peak-3, then from the $^{133}$Cs NMR spectra, the total $Cu^{2+}$ concentration in the final product is given by the equation: (2x)=⅛x (Area/%), where Area/% refers to the percent contribution of Peak-2 to the total $^{133}$Cs spectrum. For example, when x=0.10, the area for Peak-2 in the $^{133}$Cs NMR spectrum is 29.5% and thus: (2x)=(a+b)=(⅛×29.5)%=3.37%=0.037. Hence, x=(½×0.037)=0.0185. The general formula of the $Cu^{2+}$ doped material is: $Cs_2Sb_{1-a}Ag_{1-b}Cu_{2x}Cl_6$ (a+b=2x) and the (2x) value represents the fraction of octahedral sites ($Sb^{3+}$ or $Ag^+$) that are substituted by $Cu^{2+}$ ions.

TABLE 3

Calculated contributions from the three $^{133}$Cs MAS NMR peaks
(Peak-1, Peak-2, and Peak-3) and the fitted line equations.

| $^{133}$Cs NMR Peak | Area % for x (±1%) | | | | Fitted Linear Equation |
|---|---|---|---|---|---|
| | 0.00 | 0.01 | 0.05 | 0.10 | |
| Peak-1 | 100 | 97.4 | 79.8 | 67.5 | $\delta_{iso}(^{133}Cs)$/ppm = −334(32) x + 100(2); $R^2$ = 0.973 |
| Peak-2 | 0 | 2.5 | 19.1 | 29.6 | $\delta_{iso}(^{133}Cs)$/ppm = 305(34) x + 1(2); $R^2$ = 0.963 |
| Peak-3 | 0 | 0.2 | 1.1 | 2.9 | $\delta_{iso}(^{133}Cs)$/ppm = 29(3) x + 0(0); $R^2$ = 0.971 |

Figure 17:
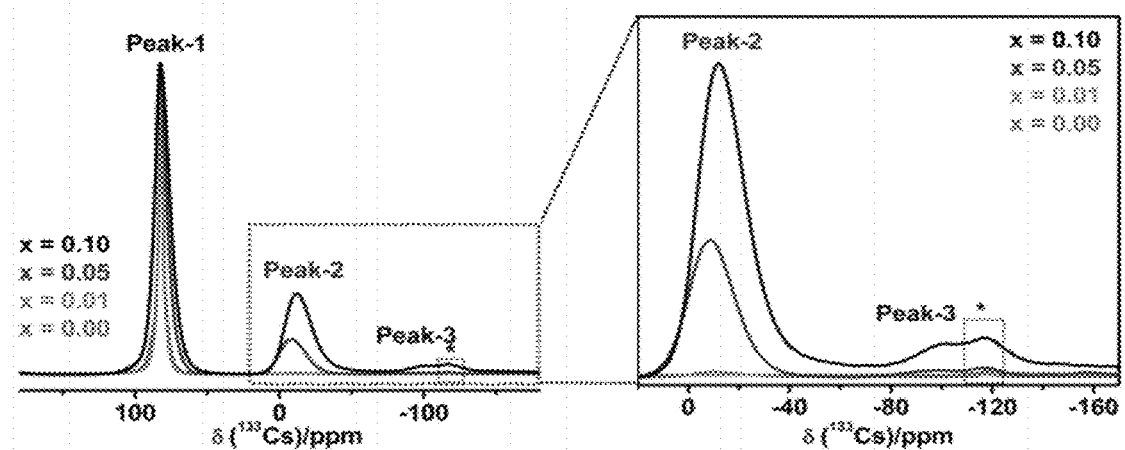
FIG. 17 shows a comparison of $^{133}Cs$ MAS NMR spectra for $Cs_2SbAgCl_6$ without (x=0.00) and with (x=0.01, 0.05, and 0.10) $Cu^{2+}$ doping according to embodiments of the present application, acquired at 11.75 T with a spinning frequency of 13 kHz, showing that the linewidth of Peak-1 increases with $Cu^{2+}$ content (left), and that the relative intensities (with respect to the normalized Peak-1) of Peak-2 and Peak-3 increase with $Cu^{2+}$ doping concentration (right). Spinning sidebands are indicated with an asterisk (*).

Peak-1 also broadened as the $Cu^{2+}$ doping increases (FIGS. 17 and 18, Tables 4 and 5) due to the incorporation of paramagnetic $Cu^{2+}$, as discussed above for the $^{121}$Sb NMR spectra. In fitting the $\delta_{iso}(^{133}Cs)$ peaks, it was found that the area for Peak-1 decreases linearly, whereas those for Peak-2 and Peak-3 increase linearly with $Cu^{2+}$ doping (FIG. 19 and Table 3).

TABLE 4

FWHM values for $^{133}$Cs MAS NMR spectra (Peak-1 and Peak-2 of FIG. 17) for $Cs_2SbAgCl_6$ without or with $Cu^{2+}$ doping, acquired at 11.75 T, T = 291K and a spinning frequency of 13 kHz.

| $Cu^{2+}$ composition (x) | FWHM (Hz) | |
|---|---|---|
| | Peak-1 | Peak-2 |
| 0.00 | 200(5) | — |
| 0.01 | 205(5) | 1350(20) |
| 0.05 | 615(10) | 1360(10) |
| 0.10 | 770(10) | 1350(10) |

TABLE 5

Figure 18:
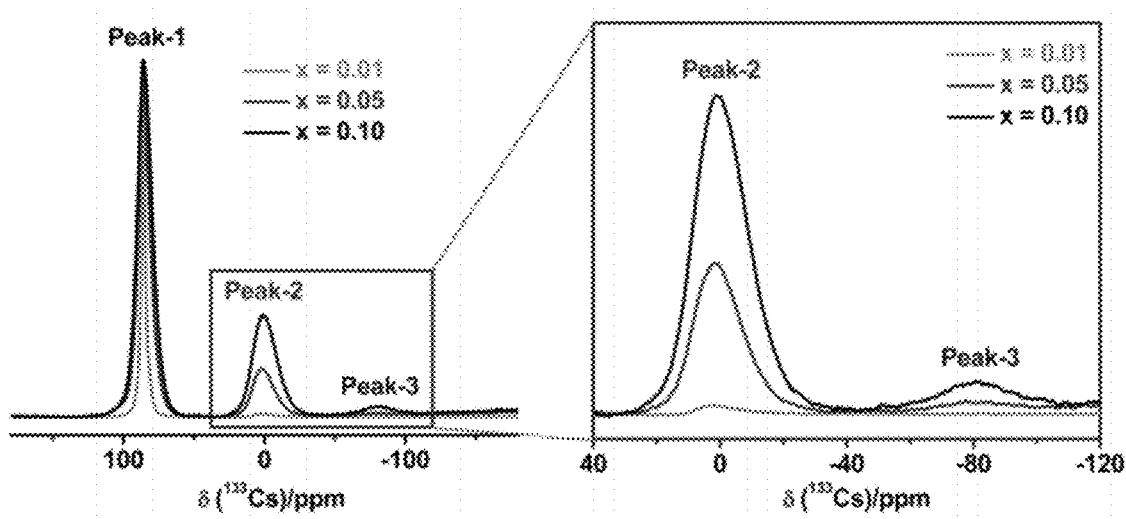
FIG. 18 shows a comparison of $^{133}Cs$ MAS NMR spectra for $Cs_2SbAgCl_6$ with $Cu^{2+}$ doping according to embodiments of the present application or without $Cu^{2+}$ doping, acquired at 21.1 T with a spinning frequency of 30 kHz, showing that the linewidth of Peak-1 increases with $Cu^{2+}$ content (left), and that the relative intensities (with respect to the normalized Peak-1) of Peak-2 and Peak-3 increase with $Cu^{2+}$ doping content (right).
Figure 19:
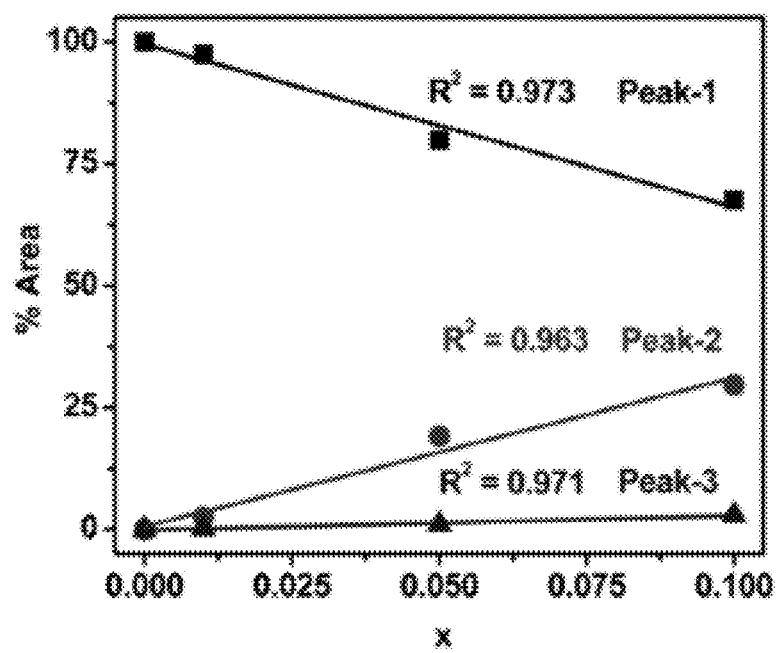
FIG. 19 is a plot showing the contributions of three $^{133}Cs$ MAS NMR peaks to the total area of the $^{133}Cs$ NMR spectra.

FWHM values of $^{133}$Cs MAS NMR spectra ($B_o$ = 21.1 T, $\omega r/2\pi$ = 30 kHz) for $Cs_2SbAgCl_6$ (FIG. 18).

| $Cu^{2+}$ composition (x) | FWHM (Hz) | | |
|---|---|---|---|
| | Peak-1 | Peak-2 | Peak-3 |
| 0.01 | 305(5) | 1625(25) | — |
| 0.05 | 1035(10) | 2080(20) | 2500(200) |
| 0.10 | 1410(10) | 2310(20) | 2700(100) |

The incorporation of $Cu^{2+}$ resulted in the appearance of new $^{133}$Cs resonances, which exhibit a linear relationship with synthetic Cu loading (FIG. 3). Using these tentatively assigned $^{133}$Cs chemical shifts, and knowledge that each copper center will impact eight cesium centers, one can also obtain an estimate of $Cu^{2+}$ incorporation post-synthesis (Table 1), although this does not account for potential $Cu^{2+}$ clusters and hence is expected to be a lower limit.

For the samples considered here, the first observation is that Peak-2 and Peak-3 are shifted to lower frequency. There are two mechanisms for paramagnetic shift: the through-space interaction between the nuclear spin and the average magnetic moment of the paramagnetic center (pseudocontact shift), and the interaction between the nuclear spin and the unpaired spin density at the nucleus itself (Fermi contact).[43] The pseudocontact contribution to the shift arises because of the interaction of the nuclear spin with the average magnetic moment of the paramagnetic center, which does not average to zero in the case when magnetic susceptibility of the metal center is anisotropic. It can be related to the magnetic susceptibility through the Kurland-McGarvey equation[44] and, for the case of S=½ spins, it can be directly related to the electron g-matrix from EPR:

$$\delta^{pc} = \frac{1}{12\pi r^3} \frac{\mu_0 \mu_B^0 S(S+1)}{3kT} (g_\parallel^2 - g_\perp^2)(3\cos^2\theta - 1)$$

Figure 20:
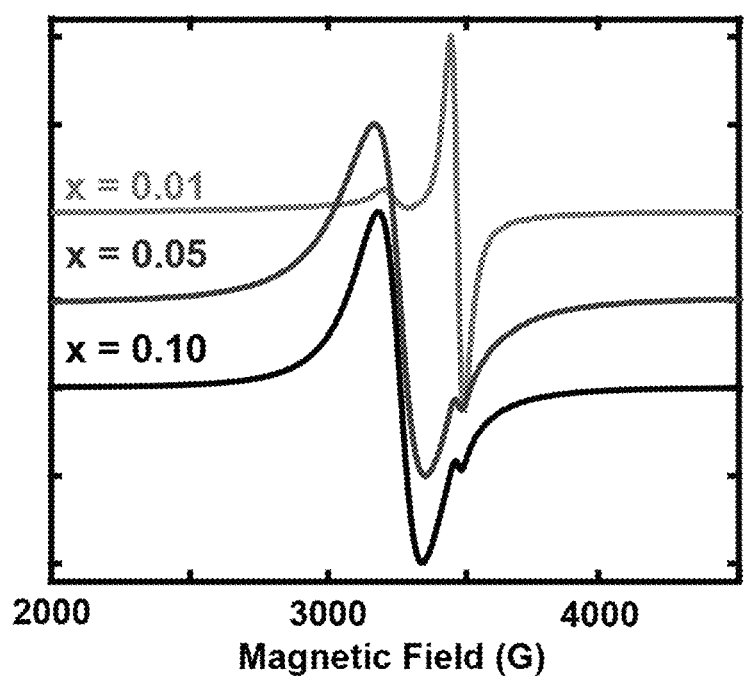
FIG. 20 shows X-band EPR spectra of $Cu^{2+}$-doped $Cs_2SbAgCl_6$ materials according to embodiments of the present application wherein x=0.01, 0.05 and 0.10 in comparison to that for the parent $Cs_2SbAgCl_6$ (x=0).

Using $g_\parallel$=2.3 and $g_\perp$=2.0, at about 4.5 Å the expected PCS value is 1.2 ppm, to which a further contribution amounting to about 20% coming from the temperature independent paramagnetism could be added.[45] Given that the pseudo-contact contribution to the shift, based on the EPR spectrum (FIG. 20) and on geometrical arguments,[43,46] is expected to be positive and smaller than 1 ppm, it was concluded that the main source of the shift is Fermi contact. The fact that the shift is to lower frequency indicates that contact occurs through the spin-polarization mechanism.[47] The Fermi contact shift is the interaction of the nucleus with the unpaired spin electron density at the nucleus itself. Therefore, Fermi contact reports on the electronic structure about the nucleus. The observation of Fermi contact indicates that the nature of the interaction of the cesium ions with the lattice is not just ionic but has some degree of covalency (i.e., orbital overlap). Finally, the mechanism of the Fermi contact suggests that the overlap is not with penetrating orbitals such as the 6s, but rather with p- or d-type orbitals.

Figure 21:
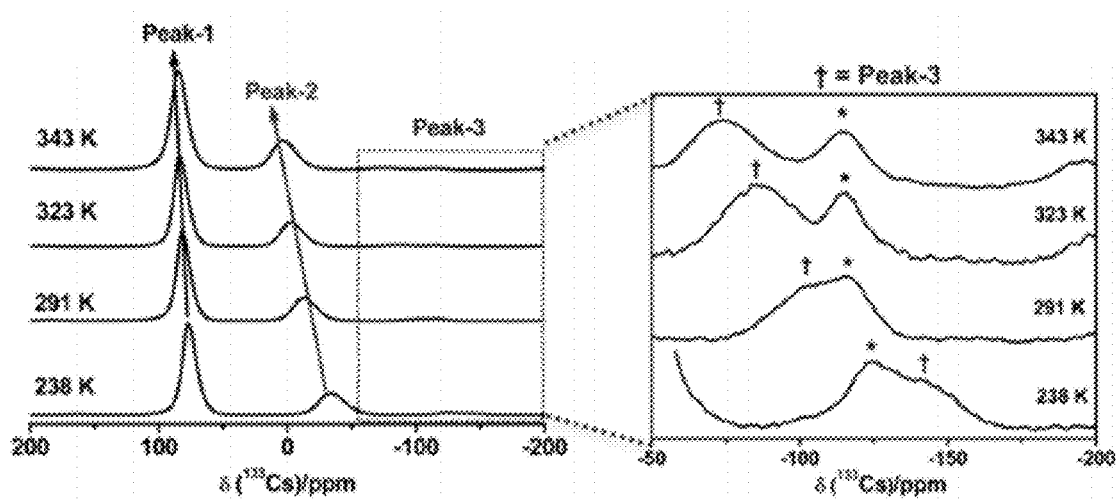
FIG. 21 shows variable temperature $^{133}Cs$ MAS NMR spectra of $Cu^{2+}$-doped material (x=0.10) according to an embodiment of the present application acquired at 11.75 T with a spinning frequency of 13 kHz (left image). Arrows are guides to the eye.

To further investigate the contributions from the paramagnetic $Cu^{2+}$ center to the three distinct $^{133}$Cs NMR chemical shifts discussed above, a series of variable-temperature $^{133}$Cs NMR measurements from 238 to 343 K on the x=0.10 $Cu^{2+}$-doped material were undertaken. The impact of paramagnetic species on the NMR spectra offers a wealth of information, encoded in the changes in chemical shifts and in a reduction of relaxation times as a consequence of the interaction between the nuclei and the unpaired electrons.[43,48] The observation of paramagnetic effects on the nuclei may provide substantial information about the electronic structure at the paramagnetic centers. The temperature dependence is a revealing feature of the behavior of paramagnetic systems and thus has proven useful in studies of a variety of solids.[47(a),49] All three $^{133}$Cs NMR peaks shift to higher frequency as the temperature is increased (FIG. 21 and Table 6), but each has a distinct temperature dependence.[33(c),34,35,50,38]

TABLE 6

Temperature dependence of chemical shifts and fitted line equations for Peak-1, Peak-2, and Peak-3 of the $^{133}$Cs MAS NMR spectra for the Cu$^{2+}$-doped material (x = 0.10); acquired at 11.75 T with a spinning frequency of 13 kHz.

| $\delta_{iso}(^{133}\text{Cs})$ | Temperature (T/K) | | | | Fitted Linear Equation |
|---|---|---|---|---|---|
| | 238 | 291 | 323 | 343 | |
| Peak-1 | 77 | 82 | 84 | 85 | $\delta_{iso}(^{133}\text{Cs})/\text{ppm} = -6.3\ (1000/T) + 102.9$; $R^2 = 0.999$ |
| Peak-2 | −34 | −13 | −3 | 3 | $\delta_{iso}(^{133}\text{Cs})/\text{ppm} = -30.9\ (1000/T) + 89.9$; $R^2 = 0.999$ |
| Peak-3 | −147 | −105 | −87 | −74 | $\delta_{iso}(^{133}\text{Cs})/\text{ppm} = -60.4\ (1000/T) + 95.4$; $R^2 = 0.998$ |

Figure 22:
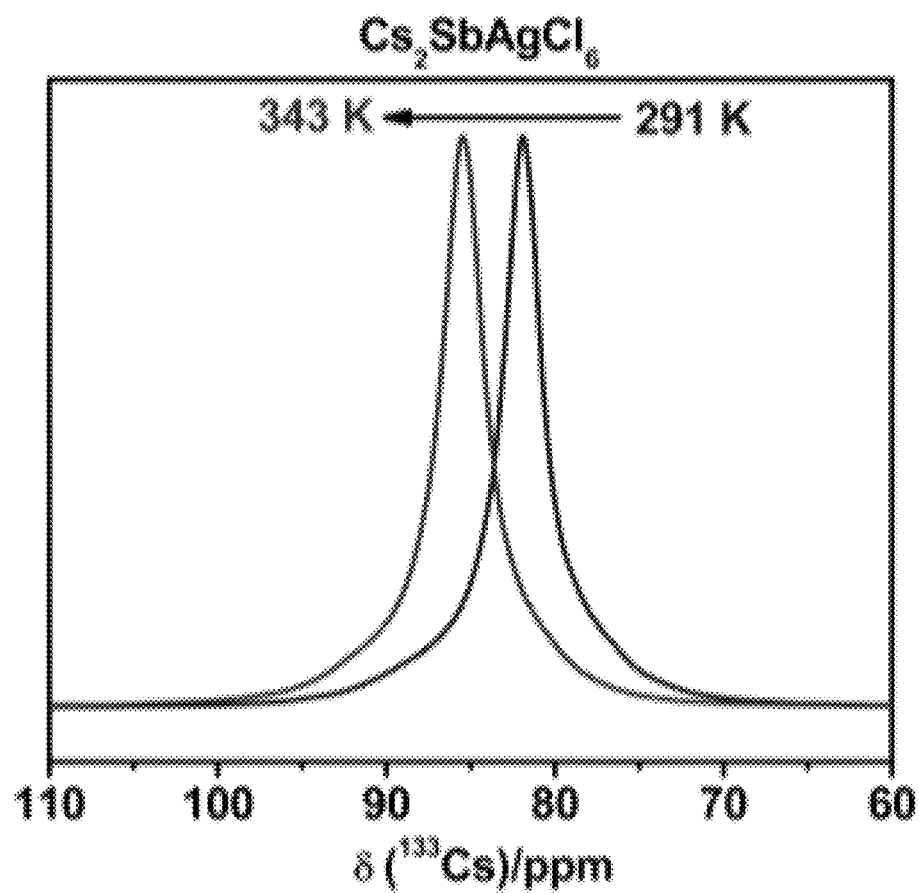
FIG. 22 shows temperature dependent $^{133}Cs$ MAS NMR spectra of the $Cs_2SbAgCl_6$ parent (x=0).
Figure 23:
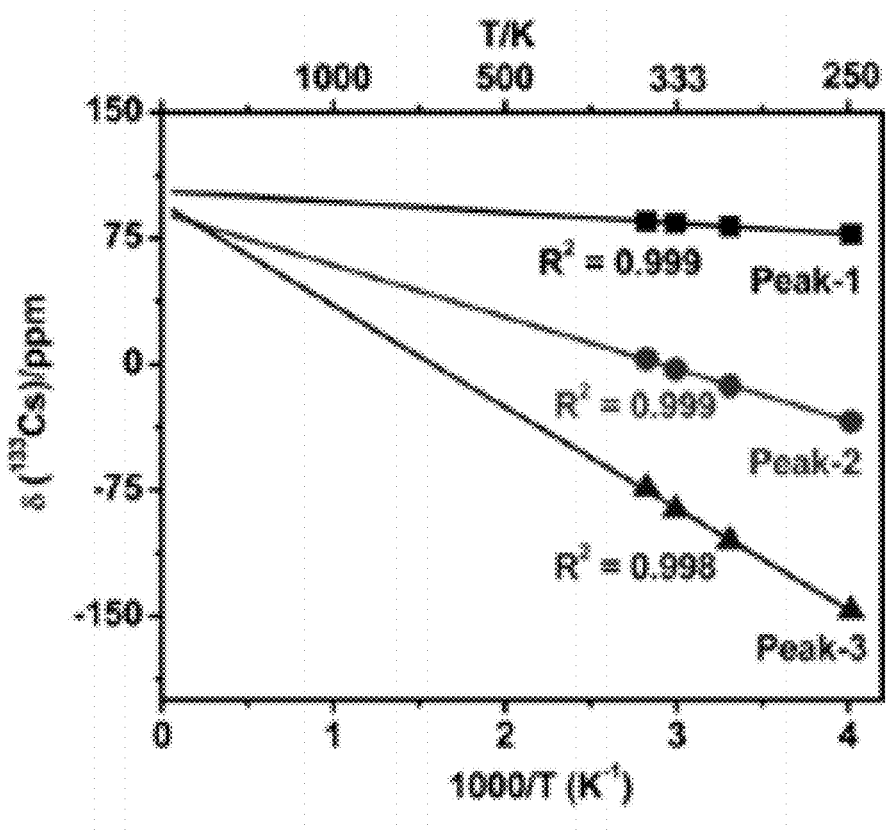
FIG. 23 shows the temperature dependence of the chemical shifts for the three distinct peaks in the $^{133}Cs$ NMR spectra.

Peak-1 changes slowly with temperature; while not wishing to be limited by theory, the small temperature dependence (0.08 ppm/K) for this peak was attributed to the temperature-induced changes in local structure, such as changes in the unit cell or position within the cuboctahedron (confirmed from variable temperature NMR spectroscopy on the Cs$_2$SbAgCl$_6$ parent material, FIG. 22). In contrast, the much larger temperature dependence of the chemical shifts of Peak-2 and Peak-3 (0.35 and 0.70 ppm/K, respectively) are a clear indication of the impact of neighboring Cu$^{2+}$ ions, confirming that the Cs residing in the A site of the double perovskite is in proximity to the induced defect site with increasing incorporation of copper. Extrapolating to "infinite temperature" gives the diamagnetic isotropic chemical shift of about 96±7 ppm, which is within the expected chemical shift range for the diamagnetic Cs$_2$SbAgCl$_6$ parent material (x=0.00, $\delta_{iso}(^{133}\text{Cs})$=85±1 ppm) at 343 K (FIG. 23). While not wishing to be limited by theory, the fact that the temperature dependence is Curie-like (i.e., the paramagnetic effect decreases with increasing temperature) and additive indicates either that contact occurs through two uncoupled copper centers or that the coupling between the two copper centers is smaller than the thermal energy.[34,43]

Figure 24:
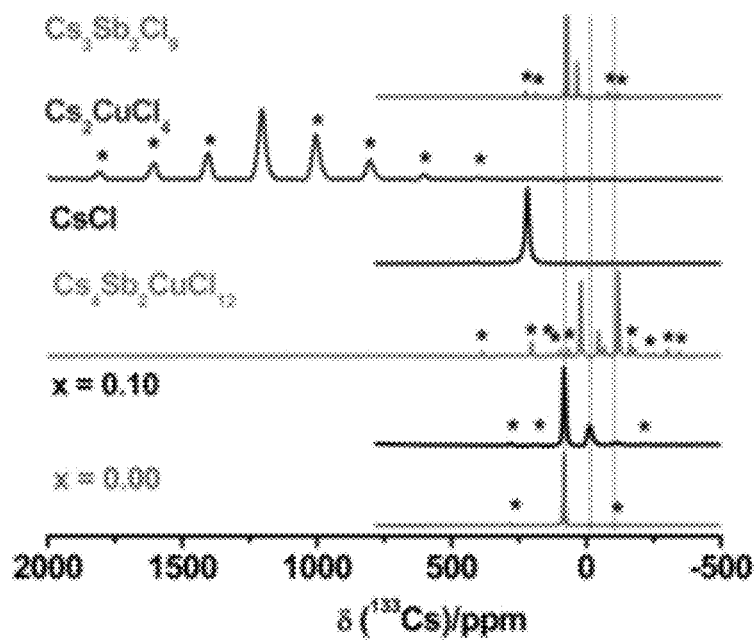
FIG. 24 shows $^{133}Cs$ MAS NMR spectra ($B_o$=11.75 T, upper image) and PXRD patterns (lower image) for $Cs_2SbAgCl_6$ (x=0.00 and 0.10 $Cu^{2+}$ doping according to an embodiment of the present application), $Cs_4Sb_2CuCl_2$, CsCl, $Cs_2CuCl_4$ and $Cs_3Sb_2Cl_9$. The asterisks (*) indicate spinning sidebands.
Figure 24:
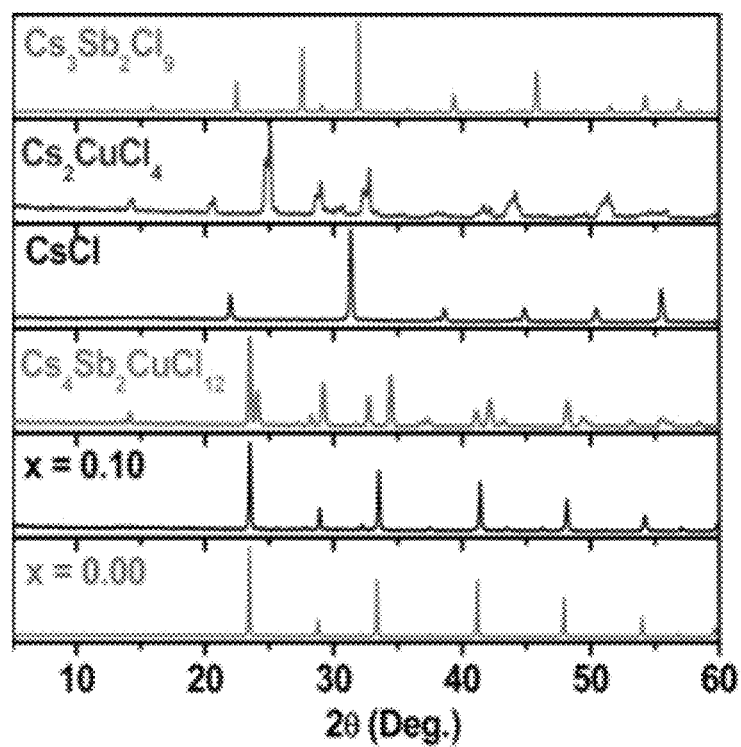

Cesium-133 MAS NMR spectra and PXRD patterns for cesium-containing chlorides, including CsCl, Cs$_3$Sb$_2$Cl$_9$, Cs$_4$CuSb$_2$Cl$_{12}$, and Cs$_2$CuCl$_4$, were acquired (FIG. 24).[21(a),51] These spectra are distinct from those for Cs$_2$SbAgCl$_6$ parent and Cu$^{2+}$-doped materials. The distinct chemical shifts for each $^{133}$Cs resonance as a function of temperature also correlate well with the EDX, ICP, and PXRD results (vide supra), leading to further support indicating that Cs$^+$ is being observed in a cuboctahedron with one and two Cu$^{2+}$ neighbors; this is consistent with the structure expected for a Cu$^{2+}$-doped Cs$_2$SbAgCl$_6$ double perovskite and not from Cs-containing impurity phases.

III. Long Term Stability

Figure 25:
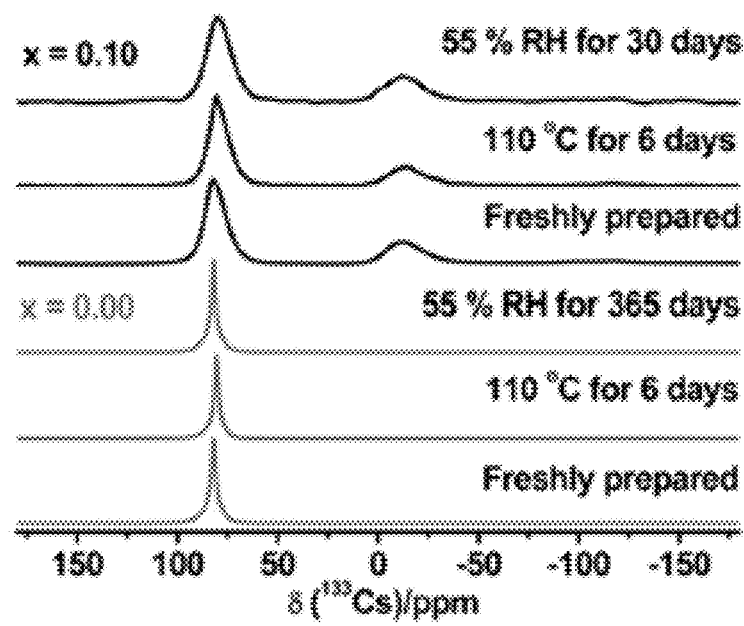
FIG. 25 shows (upper image) $^{133}Cs$ MAS NMR spectra acquired at 11.75 T with a frequency of 13 kHz for stability experiments of $Cs_2SbAgCl_6$ parent (i.e., x=0.00; bottom three traces) and the maximum $Cu^{2+}$-doped (x=0.10; top three traces) materials according to an embodiment of the present application under the conditions of, from top to bottom in each set: 55% relative humidity (RH) for 30 days, 110° C. for 6 days and freshly prepared.
Figure 25:
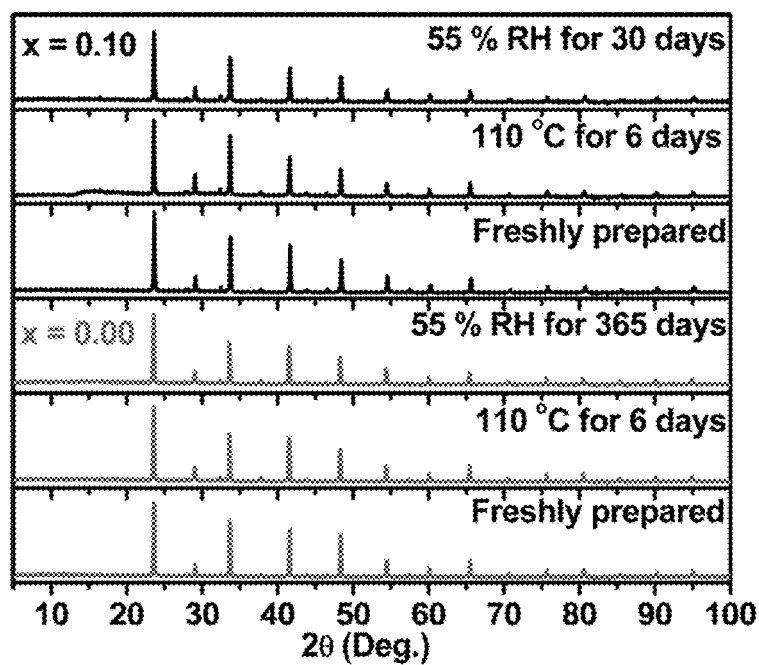
Figure 26:
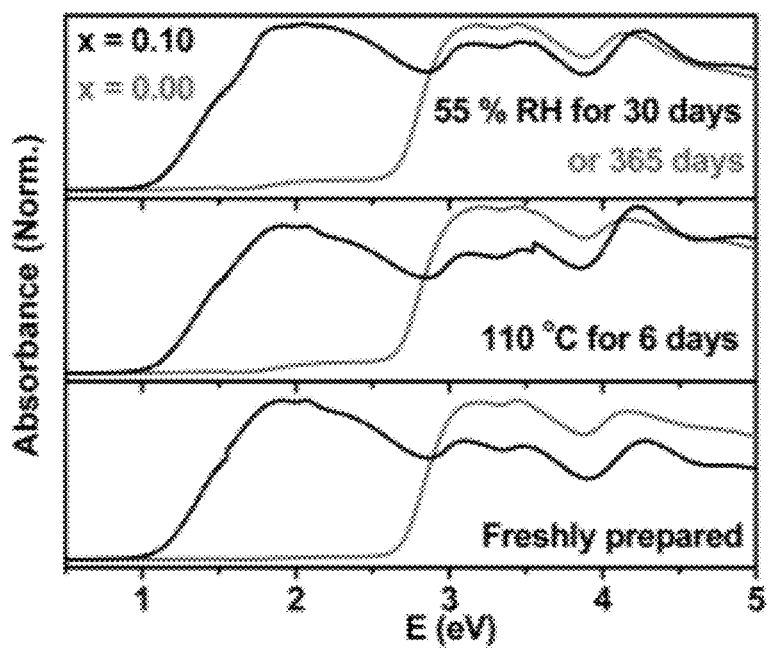
FIG. 26 shows absorption spectra of $Cs_2SbAgCl_6$ parent (x=0.00, red) and the maximum $Cu^{2+}$-doped (x=0.10, black) materials according to an embodiment of the present application under conditions of, from top to bottom: 55% relative humidity (RH) for 30 days, 110° C. for 6 days and freshly prepared (upper image). The absorption spectra were extracted from DR data by using the Kubelka-Munk equation.
Figure 26:
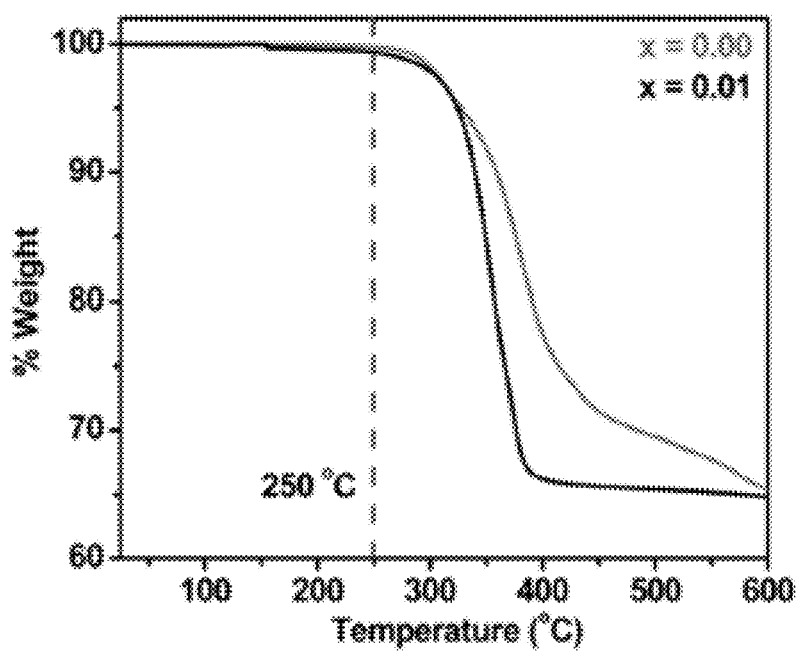

A major concern with lead-containing hybrid perovskites is their low stability upon exposure to light, moisture, and heat.[3(b),5] Therefore, the moisture and thermal stability of both the Cs$_2$SbAgCl$_6$ parent and of the Cu$^{2+}$-doped materials were examined. Polycrystalline materials were placed in a custom-built humidity chamber (FIG. 2) with a relative humidity (RH) of 55±5% under otherwise normal laboratory conditions for 365 days (x=0.00) and 30 days (x=0.10). Based on analyses of the $^{133}$Cs MAS NMR spectra (FIG. 25, upper image), PXRD patterns (FIG. 25, lower image) and absorption spectra (FIG. 26, upper image), there are no indications of decomposition from either material, and their bandgaps are retained under humid conditions. TGA indicates that materials with (x=0.01) and without Cu$^{2+}$ doping are stable up to 250° C. (FIG. 26, lower image), similar to the thermal stability for the copper-antimony (111) perovskite (245° C.) reported by Vargas et al.[21(a)] Long-term thermal stability studies were undertaken by heating these materials at 110° C. for 6 days under otherwise ambient conditions; $^{133}$Cs NMR, PXRD, and absorption spectra analysis (FIG. 25 and FIG. 26) again indicate high structural and optical stability with no evidence of decomposition.

IV. $^{121}$Sb NMR Lineshape Analysis of Cs$_2$SbAgCl$_6$

Since $^{121}$Sb has a large quadrupole moment (Q=−36.0 fm$^2$) and I=5/2, the lineshape and breadth of the NMR spectra are often dominated by the quadrupolar interaction. However, for the parent Cs$_2$SbAgCl$_6$ material, the Sb sites are located at an octahedral position within a cubic space group such that the overall EFG would be expected to be zero. In practice, slight defects or distortions within the lattice may impact the symmetry about some $^{121}$Sb nuclei, such that a quadrupolar interaction is detected despite the octahedral symmetry. Analysis of the spectra acquired under non-spinning and MAS conditions as well as at multiple field strengths assist in determining these interactions. Other anisotropic interactions that may contribute to the linewidth and shape include magnetic shielding anisotropy, and direct (dipolar) and indirect (J-coupling) spin-spin coupling. A small quadrupolar interaction of 1 MHz would lead to a 30 Hz second order broadening contribution at 21.1 T, while the non-spinning linewidth is 3.2 kHz. The linewidth remains nearly constant across three magnetic field strengths (B$_o$=7.05, 11.75 and 21.1 T). Since magnetic shielding scales linearly with field and the second order quadrupole broadening is inversely related, these anisotropic interactions are negligible in their contribution (i.e. <1 ppm). Magic-angle spinning reduces the linewidth by nearly 50% (1.5 kHz) to a FWHM of 1.8 kHz, indicating a contribution from heteronuclear dipole coupling between $^{121}$Sb and $^{35/37}$Cl, the remaining MAS linewidth is attributed to indirect spin-spin coupling between $^{121}$Sb (N.A.=57.2%) and the six coordinating $_{35/37}$Cl anions ($^{35}$Cl: N.A.=75.8%, I=3/2 and $^{37}$Cl: N.A.=24.2%, I=3/2). The Gaussian-like $^{121}$Sb peak is attributed to the complex splitting pattern arising from spin-spin coupling of $^{121}$Sb to the two Cl isotopes, further complicated by the quadrupole coupling interaction expected for the Cl isotopes, which is expected to be significant since these nuclei are not in a high-symmetry position. Hence, a complex J-splitting pattern that is unresolved at 7.05 T is observed.[52]

V. Summary/Conclusions

In this example, Cs$_2$SbAgCl$_6$ and its Cu$^{2+}$-doped double perovskite materials were investigated. The PXRD, EPR, and NMR results indicate a well-ordered double perovskite cubic crystal structure with Cu$^{2+}$ integrated into the lattice, creating local defect sites in multiple local Cs$^+$ and Sb$^{3+}$ arrangements, whereby $Cu^{2+}$ preferentially substitutes for $Ag^+$. These findings are further reinforced by EDX measurements and are consistent with Pauling electronegativity arguments. The optical properties of the material are directly related to the $Cu^{2+}$ doping, which leads to a reduction of the optical indirect bandgap, from 2.65 eV for the parent material to 1.02 eV for the x=0.10 $Cu^{2+}$-doped material. The material's feasibility for photovoltaic applications was further examined through thermal and moisture exposure, demonstrating long-term structural and photophysical stability up to 365 days. Likewise, a series of DFT calculations for double perovskites including the parent compound studied here ($Cs_2SbAgCl_6$) indicate these materials exhibit small carrier effective masses (<0.4 $m_o$), which are comparable to those calculated for $MAPbI_3$.[39,53] Based on the observations discussed above, while not wishing to be limited by theory, $Cu^{2+}$ doping creates a cation defect, which could, for example, lead to an increase in conductivity. In summary, the antimony-silver based double perovskites presented herein exhibit several desirable properties in comparison to lead halide perovskites including the potential for greater bandgap tunability and superior stability, as well as being composed of inexpensive and highly abundant elements.

While the present application has been described with reference to what are presently considered to be the preferred examples, it is to be understood that the application is not limited to the disclosed examples. To the contrary, the present application is intended to cover various modifications and equivalent arrangements included within the spirit and scope of the appended claims.

All publications, patents and patent applications are herein incorporated by reference in their entirety to the same extent as if each individual publication, patent or patent application was specifically and individually indicated to be incorporated by reference in its entirety. Where a term in the present application is found to be defined differently in a document incorporated herein by reference, the definition provided herein is to serve as the definition for the term.

FULL CITATIONS FOR DOCUMENTS REFERRED TO IN THE DESCRIPTION

[1] (a) Kojima, A.; Teshima, K.; Shirai, Y.; Miyasaka, T. Organometal Halide Perovskites as Visible-Light Sensitizers for Photovoltaic Cells. J. Am. Chem. Soc. 2009, 131, 6050-6051. (b) Green, M. A.; Hishikawa, Y.; Warta, W.; Dunlop, E. D.; Levi, D. H.; Hohl-Ebinger, J.; Ho-Baillie, A. W. H. Solar Cell Efficiency Tables (version 50). Prog. Photovoltaics 2017, 25, 668-676.

[2] (a) Tan, Z.-K.; Moghaddam, R. S.; Lai, M. L.; Docampo, P.; Higler, R.; Deschler, F.; Price, M.; Sadhanala, A.; Pazos, L. M.; Credgington, D.; et al. Bright Light-Emitting Diodes Based on Organometal Halide Perovskite. Nat. Nanotechnol. 2014, 9, 687-692. (b) Zhu, H.; Fu, Y.; Meng, F.; Wu, X.; Gong, Z.; Ding, Q.; Gustafsson, M. V.; Trinh, M. T.; Jin, S.; Zhu, X. Y. Lead Halide Perovskite Nanowire Lasers with Low Lasing Thresholds and High Quality Factors. Nat. Mater. 2015, 14, 636-642. (c) Xing, G.; Mathews, N.; Lim, S. S.; Yantara, N.; Liu, X.; Sabba, D.; Grätzel, M.; Mhaisalkar, S.; Sum, T. C. Low-Temperature Solution-Processed Wavelength-Tunable Perovskites for Lasing. Nat. Mater. 2014, 13, 476-480. (d) Jeon, N. J.; Noh, J. H.; Yang, W. S.; Kim, Y. C.; Ryu, S.; Seo, J.; Seok, S. I. Compositional Engineering of Perovskite Materials for High-Performance Solar Cells. Nature 2015, 517, 476-480. (e) Liu, M.; Johnston, M. B.; Snaith, H. J. Efficient Planar Heterojunction Perovskite Solar Cells by Vapour Deposition. Nature 2013, 501, 395-398. (f) Shi, D.; Adinolfi, V.; Comin, R.; Yuan, M.; Alarousu, E.; Buin, A.; Chen, Y.; Hoogland, S.; Rothenberger, A.; Katsiev, K.; et al. Low Trap-State Density and Long Carrier Diffusion in Organolead Trihalide Perovskite Single Crystals. Science 2015, 347, 519-522.

[3] (a) Yang, J.; Siempelkamp, B. D.; Mosconi, E.; De Angelis, F.; Kelly, T. L. Origin of the Thermal Instability in $CH_3NH_3PbI_3$ Thin Films Deposited on ZnO. Chem. Mater. 2015, 27, 4229-4236. (b) Berhe, T. A.; Su, W.-N.; Chen, C.-H.; Pan, C.-J.; Cheng, J.-H.; Chen, H.-M.; Tsai, M.-C.; Chen, L.-Y.; Dubale, A. A.; Hwang, B.-J. Organometal Halide Perovskite Solar Cells: Degradation and Stability. Energy Environ. Sci. 2016, 9, 323-356.

[4] (a) Needleman, H. Lead Poisoning. Annu. Rev. Med. 2004, 55, 209-222. (b) Babayigit, A.; Ethirajan, A.; Muller, M.; Conings, B. Toxicity of Organometal Halide Perovskite Solar Cells. Nat. Mater. 2016, 15, 247-251.

[5] (a) Christians, J. A.; Miranda Herrera, P. A.; Kamat, P. V. Transformation of the Excited State and Photovoltaic Efficiency of $CH_3NH_3PbI_3$ Perovskite upon Controlled Exposure to Humidified Air. J. Am. Chem. Soc. 2015, 137, 1530-1538. (b) Leguy, M. A.; Hu, Y.; Campoyquiles, M.; Alonso, M. I.; Weber, O. J.; Azarhoosh, P.; van Schilfgaarde, M.; Weller, M. T.; Bein, T.; Nelson, J.; Docampo, P.; Barnes, P. R. F. Reversible Hydration of $CH_3NH_3PbI_3$ in Films, Single Crystals, and Solar Cells. Chem. Mater. 2015, 27, 3397-3407. (c) Askar, A. M.; Bernard, G. M.; Wiltshire, B.; Shankar, K.; Michaelis, V. K. Multinuclear Magnetic Resonance Tracking of Hydro, Thermal, and Hydrothermal Decomposition of $CH_3NH_3PbI_3$. J. Phys. Chem. C 2017, 121, 1013-1024.

[6] (a) Saliba, M.; Matsui, T.; Seo, J. Y.; Domanski, K.; Correa-Baena, J. P.; Nazeeruddin, M. K.; Zakeeruddin, S. M.; Tress, W.; Abate, A.; Hag-feldt, A.; et al. Cesium-Containing Triple Cation Perovskite Solar Cells: Improved Stability, Reproducibility and High Efficiency. Energy Environ. Sci. 2016, 9, 1989-1997. (b) Li, Z.; Yang, M.; Park, J. S.; Wei, S. H.; Berry, J. J.; Zhu, K. Stabilizing Perovskite Structures by Tuning Tolerance Factor: Formation of Formamidinium and Cesium Lead Iodide Solid-State Alloys. Chem. Mater. 2016, 28, 284-292. (c) Zhang, M.; Yun, J. S.; Ma, Q.; Zheng, J.; Lau, C. F. J.; Deng, X.; Kim, J.; Kim, D.; Seidel, J.; Green, M. A.; et al. High-Efficiency Rubidium-Incorporated Perovskite Solar Cells by Gas Quenching. ACS Energy Lett. 2017, 2, 438-444.

[7] (a) Eperon, G. E.; Leijtens, T.; Bush, K. A.; Green, T.; Wang, J. T.-W.; McMeekin, D. P.; Volonakis, G.; Milot, R. L.; Slotcavage, D. J.; Belisle, R.; et al. Perovskite-Perovskite Tandem Photovoltaics with Ideal Bandgaps. Science 2016, 354, 861-865. (b) Tan, H.; Jain, A.; Voznyy, O.; Lan, X.; Arquer, F. P. G. de; Fan, J. Z.; Quintero-Bermudez, R.; Yuan, M.; Zhang, B.; Zhao, Y.; et al. Efficient and Stable Solution Processed Planar Perovskite Solar Cell via Contact Passivation. Science 2017, 355, 722-726.

[8] (a) Lau, C. F. J.; Zhang, M.; Deng, X.; Zheng, J.; Bing, J.; Ma, Q.; Kim, J.; Hu, L.; Green, M. A.; Huang, S.; et al. Stronti-um-Doped Low-Temperature-Processed $CsPbI_2Br$ Perovskite Solar Cells. ACS Energy Lett. 2017, 2, 2319-2325. (b) Zuo, F.; Williams, S. T.; Liang, P. W.; Chueh, C. C.; Liao, C. Y.; Jen, A. K. Y. Binary-Metal Perovskites Toward High-Performance Planar-Heterojunction Hybrid Solar Cells. Adv. Mater. 2014, 26, 6454-6460. (c) Klug, M. T.; Osherov, A.; Haghighirad, A. A.; Stranks, S. D.; Brown, P. R.; Bai, S.; Wang, J. T. W.;

Dang, X.; Bulović, V.; Snaith, H. J.; et al. Tailoring Metal Halide Perovskites through Metal Substitution: Influence on Photovoltaic and Material Properties. Energy Environ. Sci. 2017, 10, 236-246.

[9] Abdelhady, A. L.; Saidaminov, M. I.; Murali, B.; Adinolfi, V.; Voznyy, O.; Katsiev, K.; Alarousu, E.; Comin, R.; Dursun, I.; Sinatra, L.; et al. Heterovalent Dopant Incorporation for Bandgap and Type Engineering of Perovskite Crystals. J. Phys. Chem. Lett. 2016, 7, 295-301.

[10] (a) Levchuk, I.; Osvet, A.; Tang, X.; Brandl, M.; Perea, J. D.; Hoegl, F.; Matt, G. J.; Hock, R.; Batentschuk, M.; Brabec, C. J. Brightly Luminescent and Color-Tunable Formamidinium Lead Halide Perovskite FAPbX3 (X=Cl, Br, I) Colloidal Nanocrystals. Nano Lett. 2017, 17, 2765-2770. (b) Hu, Y.; Bai, F.; Liu, X.; Ji, Q.; Miao, X.; Qiu, T.; Zhang, S. Bismuth Incorporation Stabilized $\alpha$-CsPbI$_3$ for Fully Inorganic Perovskite Solar Cells. ACS Energy Lett. 2017, 2, 2219-2227. (c) Lee, J.-W.; Kim, D.-H.; Kim, H.-S.; Seo, S.-W.; Cho, S. M.; Park, N.-G. Formamidinium and Cesium Hybridization for Photo- and Moisture-Stable Perovskite Solar Cell. Adv. Energy Mater. 2015, 5, 1501310.

[11] Dang, Y.; Zhou, Y.; Liu, X.; Ju, D.; Xia, S.; Xia, H.; Tao, X. Formation of Hybrid Perovskite Tin Iodide Single Crystals by Top-Seeded Solution Growth. Angew. Chem., Int. Ed. 2016, 55, 3447-3450.

[12] Babu, R.; Giribabu, L.; Singh, S. P. Recent Advances in Halide-Based Perovskite Crystals and their Optoelectronic Applications. Cryst. Growth Des. 2018, 18, 2645-2664.

[13] (a) Slavney, A. H.; Hu, T.; Lindenberg, A. M.; Karunadasa, H. I. A Bismuth-Halide Double Perovskite with Long Carrier Recombination Lifetime for Photovoltaic Applications. J. Am. Chem. Soc. 2016, 138, 2138-2141. (b) Volonakis, G.; Haghighirad, A. A.; Milot, R. L.; Sio, W. H.; Filip, M. R.; Wenger, B.; Johnston, M. B.; Herz, L. M.; Snaith, H. J.; Giustino, F. Cs$_2$InAgCl$_6$: A New Lead-Free Halide Double Perovskite with Direct Band Gap. J. Phys. Chem. Lett. 2017, 8, 772-778. (c) McClure, E. T.; Ball, M. R.; Windl, W.; Woodward, P. M. Cs$_2$AgBiX$_6$ (X=Br, C): New Visible Light Absorbing, Lead-Free Halide Perovskite Semiconductors. Chem. Mater. 2016, 28, 1348-1354. (d) Filip, M. R.; Liu, X.; Miglio, A.; Hautier, G.; Giustino, F. Phase Diagrams and Stability of Lead-Free Halide Double Perovskites Cs$_2$BB'X$_6$: B=Sb and Bi, B'=Cu, Ag, and Au, and X=C, Br, and I. J. Phys. Chem. C 2018, 122, 158-170. (e) Jain, A.; Voznyy, O.; Sargent, E. H. High-Throughput Screening of Lead-Free Perovskite-like Materials for Optoelectronic Applications. J. Phys. Chem. C 2017, 121, 7183-7187. (f) Wei, F.; Deng, Z.; Sun, S.; Zhang, F.; Evans, D. M.; Kieslich, G.; Tominaka, S.; Carpenter, M. A.; Zhang, J.; Bristowe, P. D.; et al. Synthesis and Properties of a Lead-Free Hybrid Double Perovskite: (CH$_3$NH$_3$)$_2$AgBiBr$_6$. Chem. Mater. 2017, 29, 1089-1094.

[14] (a) Du, K. Z.; Meng, W.; Wang, X.; Yan, Y.; Mitzi, D. B. Bandgap Engineering of Lead-Free Double Perovskite Cs$_2$AgBiBr$_6$ through Trivalent Metal Alloying. Angew. Chem., Int. Ed. 2017, 56, 8158-8162. (b) Tran, T. T.; Panella, J. R.; Chamorro, J. R.; Morey, J. R.; McQueen, T. M. Designing Indirect-Direct Bandgap Transitions in Double Perovskites. Mater. Horiz. 2017, 4, 688-693. (c) Slavney, A. H.; Leppert, L.; Bartesaghi, D.; Gold-Parker, A.; Toney, M. F.; Savenije, T. J.; Neaton, J. B.; Karunadasa, H. I. Defect-Induced Band-Edge Reconstruction of a Bismuth-Halide Double Perovskite for Visible-Light Absorption. J. Am. Chem. Soc. 2017, 139, 5015-5018.

[15] Deng, W.; Deng, Z.; He, J.; Wang, M.; Chen, Z.; Wei, S.; Feng, H.-J. Synthesis of Cs$_2$AgSbCl$_6$ and Improved Optoelectronic Properties of Cs$_2$AgSbCl$_6$/TiO$_2$ Heterostructure Driven by the Interface Effect for Lead-Free Double Perovskites Solar Cells. Appl. Phys. Lett. 2017, 111, 151602.

[16] (a) Bekenstein, Y.; Dahl, J. C.; Huang, J.; Osowiecki, W. T.; Swabeck, J. K.; Chan, E. M.; Yang, P.; Alivisatos, A. P. The Making and Breaking of Lead-Free Double Perovskite Nanocrystals of Cesium Silver-Bismuth Halide Compositions. Nano Lett. 2018, 18, 3502-3508. (b) Creutz, S. E.; Crites, E. N.; De Siena, M. C.; Gamelin, D. R. Colloidal Nanocrystals of Lead-Free Double-Perovskite (Elpasolite) Semiconductors: Synthesis and Anion Exchange to Access New Materials. Nano Lett. 2018, 18, 1118-1123.

[17] Connor, B. A.; Leppert, L.; Smith, M. D.; Neaton, J. B.; Karunadasa, H. I. Layered Halide Double Perovskites: Dimensional Reduction of Cs$_2$AgBiBr$_6$. J. Am. Chem. Soc. 2018, 140, 5235-5240.

[18] Pantaler, M.; Cho, K. T.; Queloz, V.; Garcia Benito, I.; Fettkenhauer, C.; Anusca, I.; Nazeeruddin, M. K.; Lupascu, D. C.; Grancini, G. Hysteresis-Free Lead-Free Double Perovskite Solar Cells by Interface Engineering. ACS Energy Lett. 2018, 3, 1781-1786.

[19] Greul, E.; Petrus, M. L.; Binek, A.; Docampo, P.; Bein, T. Highly Stable, Phase Pure Cs$_2$AgBiBr$_6$ Double Perovskite Thin Films for Optoelectronic Applications. J. Mater. Chem. A 2017, 5, 19972-19981.

[20] Slavney, A. H.; Leppert, L.; Saldivar Valdes, A.; Bartesaghi, D.; Savenije, T. J.; Neaton, J. B.; Karunadasa, H. Small-Bandgap Halide Double Perovskites. Angew. Chem., Int. Ed. 2018, 57, 12765-12770.

[21] (a) Vargas, B.; Ramos, E.; Pérez-Gutiérrez, E.; Alonso, J. C.; Solis-Ibarra, D. A Direct Bandgap Copper-Antimony Halide Perovskite. J. Am. Chem. Soc. 2017, 139, 9116-9119. (b) Singhal, N.; Chakraborty, R.; Ghosh, P.; Nag, A. Low-Bandgap Cs$_4$CuSb$_2$Cl$_{12}$ Layered Double Perovskite: Synthesis, Reversible Thermal Changes, and Magnetic Interaction. Chem.-Asian J. 2018, 13, 2085-2092.

[22] (a) Abram, R. A.; Rees, G. J.; Wilson, B. L. H. Heavily Doped Semiconductors and Devices. Adv. Phys. 1978, 27, 799-892. (b) Piao, Y.; Meany, B.; Powell, L. R.; Valley, N.; Kwon, H.; Schatz, G. C.; Wang, Y. Brightening of Carbon Nanotube Photoluminescence through the Incorporation of sp$^3$ Defects. Nat. Chem. 2013, 5, 840-845.

[23] (a) Misra, R. K.; Aharon, S.; Li, B.; Mogilyansky, D.; Visoly-Fisher, I.; Etgar, L.; Katz, E. A. Temperature- and Component-Dependent Degradation of Perovskite Photovoltaic Materials under Concentrated Sunlight. J. Phys. Chem. Lett. 2015, 6, 326-330. (b) Shao, H.; Bai, X.; Cui, H.; Pan, G.; Jing, P.; Qu, S.; Zhu, J.; Zhai, Y.; Dong, B.; Song, H. White Light Emission in Bi$^{3+}$/Mn$^{2+}$ Ion Co-Doped CsPbCl$_3$ Perovskite Nanocrystals. Nanoscale 2018, 10, 1023-1029. (c) Das Adhikari, S.; Dutta, A.; Dutta, S. K.; Pradhan, N. Layered Perovskites L$_2$(Pb$_{1-x}$Mn$_x$)Cl$_4$ to Mn-Doped CsPbCl$_3$ Perovskite Platelets. ACS Energy Lett. 2018, 3, 1247-1253. (d) Meinardi, F.; Akkerman, Q. A.; Bruni, F.; Park, S.; Mauri, M.; Dang, Z.; Manna, L.; Brovelli, S. Doped Halide Perovskite Nanocrystals for Reabsorption-Free Luminescent Solar Concentrators. ACS Energy Lett. 2017, 2, 2368-2377.

[24] Zhou, Y.; Chen, J.; Bakr, O. M.; Sun, H. Metal-Doped Lead Halide Perovskites: Synthesis, Properties, and Optoelectronic Applications. Chem. Mater. 2018, 30, 6589-6613.

[25] K, N. N.; Nag, A. Synthesis and Luminescence of Mn-Doped $Cs_2AgInCl_6$ Double Perovskites. Chem. Commun. 2018, 54, 5205-5208.

[26] Yin, W.; Shi, T.; Yan, Y. Superior Photovoltaic Properties of Lead Halide Perovskites: Insights from First-Principles Theory. J. Phys. Chem. C 2015, 119, 5253-5264.

[27] Kubelka, P.; Munk, F. Z. Ein Beitrag Zur Optik Der Farbanstriche. Technol. Phys. 1931, 12, 593-601.

[28] (a) Mansfield, P. Multiple-Pulse Nuclear Magnetic Resonance Transients in Solids. Phys. Rev. 1965, 137, A961-A974. (b) Bodart, P. R.; Amoureux, J. P.; Dumazy, Y.; Lefort, R. Theoretical and Experimental Study of Quadrupolar Echoes for Half-integer Spins in Static Solid State NMR. Mol. Phys. 2000, 98, 1545-1551. (c) Davis, J. H.; Jeffrey, K. R.; Bloom, M.; Valic, M. I.; Higgs, T. P. Quadrupolar Echo Deuteron Magnetic Resonance Spectroscopy in Ordered Hydrocarbon Chains. Chem. Phys. Lett. 1976, 42, 390-394.

[29] (a) Faucher, A.; Terskikh, V. V; Wasylishen, R. E. Assessing Distortion of the $AF_6$ (A=As, Sb) Octahedra in Solid Hexafluorometallates (V) via NMR Spectroscopy. Can. J. Chem. 2015, 93, 938-944. (b) Harris, R. K.; Becker, E. D.; de Menrzes, S. M. C.; Goodfellow, R.; Granger, P. Commission on Molecular Structure and Spectroscopy. Pure Appl. Chem. 2001, 73, 1795-1818.

[30] Bernard, G. M.; Goyal, A.; Miskolzie, M.; McKay, R.; Wu, Q.; Wasylishen, R. E.; Michaelis, V. K. Methylammonium Lead Chloride: A Sensitive Sample for an Accurate NMR Thermometer. J. Magn. Reson. 2017, 283, 14-21.

[31] Jeener, J.; Meier, B. H.; Bachmann, P.; Ernst, R. R. Investigation of Exchange Processes by Two-dimensional NMR Spectroscopy. J. Chem. Phys. 1979, 71, 4546-4553.

[32] Hull, S.; Keen, D. A. Pressure-Induced Phase Transitions in AgCl, AgBr, and Ag. Phys. Rev. B 1999, 59, 750-761.

[33] (a) Yang, M.; Wen-chen, Z.; Lv, H. Defect Structure and Spin-Hamiltonian Parameters for the $CuCl_6^{4-}$ Cluster in the Tetragonal $RbCdCl_3:Cu^{2+}$ crystal. Spectrochim. Acta, Part A 2009, 72, 515-517. (b) Wei, M.; Willett, R. D.; Hipps, K. W. EPR, Electronic, and Vibrational Spectra of the $CuCl_6^{4-}$ Anion in [tris(2-aminoethyl)-amineH$_4$]$_2$ [$CuCl_6$]$Cl_4 \cdot 2H_2O$ and Crystal Structure of the Complex. Inorg. Chem. 1996, 35, 5300-5303. (c) Mcdonald, R. G.; Hitchman, M. A. Electronic, EPR and Vibrational Spectra of the Hexachlorocuprate(4−) Ion. Inorg. Chem. 1989, 28, 3996-4001.

[34] Stratemeier, H.; Wagner, B.; Krausz, E. R.; Linder, R.; Schmidtke, H.; Pebler, J.; Hatfield, W. E.; ter Haar, L.; Reinen, D.; Hitchman, M. A. EPR and Electronic Spectra of (3-chloroanilinium)$_8$[$CuCl_6$]$Cl_4$: Evidence for Tetragonally Elongated $CuCl_6^{4-}$ Ions with the Long Axis Disordered in 2-Dimensions. Inorg. Chem. 1994, 33, 2320-2329.

[35] Shannon, B. Y. R. D.; H, M.; Baur, N. H.; Gibbs, O. H.; Eu, M.; Cu, V. Revised Effective Ionic R384747adii and Systematic Studies of Interatomie Distances in Halides and Chaleogenides. Acta Crystallogr., Sect. A: Cryst. Phys., Diffr., Theor. Gen. Crystallogr. 1976, 32, 751-767.

[36] Pramanick, A.; Wang, X. P.; Hoffmann, C.; Diallo, S. O.; Jorgensen, M. R. V; Wang, X. Microdomain Dynamics in Single-Crystal $BaTiO_3$ during Paraelectric-Ferroelectric Phase Transition Measured with Time-of-Flight Neutron Scattering. Phys. Rev. B: Condens. Matter Mater. Phys. 2015, 92, 174103.

[37] Nayak, P.; Sendner, M.; Wenger, B.; Wang, Z.; Sharma, K.; Ramadan, A. J.; Lovrincic, R.; Pucci, A.; Madhu, P. K.; Snaith, H. J. The Impact of $Bi^{3+}$ Heterovalent Doping in Organic-Inorganic Metal Halide Perovskite Crystals. J. Am. Chem. Soc. 2018, 140, 574-577.

[38] Fedeli, P.; Gazza, F.; Calestani, D.; Ferro, P.; Besagni, T.; Zappettini, A.; Calestani, G.; Marchi, E.; Ceroni, P.; Mosca, R. Influence of the Synthetic Procedures on the Structural and Optical Properties of Mixed-Halide (Br, I) Perovskite Films. J. Phys. Chem. C 2015, 119, 21304-21313.

[39] Volonakis, G.; Filip, M. R.; Haghighirad, A. A.; Sakai, N.; Wenger, B.; Snaith, H. J.; Giustino, F. Lead-Free Halide Double Perovskites via Heterovalent Substitution of Noble Metals. J. Phys. Chem. Lett. 2016, 7, 1254-1259.

[40] (a) Knop, O.; Wasylishen, R. E.; White, M. A.; Cameron, T. S.; Van Oort, M. J. M. Alkylammonium Lead Halides. Part 2. $CH_3NH_3PbX_3$ (X=Cl, Br, I) Perovskites: Cuboctahedral Halide Cages with Isotropic Cation Reorientation. Can. J. Chem. 1990, 68, 412-422. (b) Kubicki, D. J.; Prochowicz, D.; Hofstetter, A.; Zakeeruddin, S. M.; Grstzel, M.; Emsley, L. Phase Segregation in Potassium-Doped Lead Halide Perovskites from $^{39}$K Solid-State NMR at 21.1 T. J. Am. Chem. Soc. 2018, 140, 7232-7238. (c) Senocrate, A.; Moudrakovski, I.; Kim, G. Y.; Yang, T.; Gregori, G.; Grstzel, M.; Maier, J. The Nature of Ion Conduction in Methylammonium Lead Iodide: A Multimethod Approach. Angew. Chem., Int. Ed. 2017, 56, 7755-7759. (d) Fabini, D. H.; Siaw, T. A.; Stoumpos, C. C.; Laurita, G.; Olds, D.; Page, K.; Hu, J. G.; Kanatzidis, M. G.; Han, S.; Seshadri, R. Universal Dynamics of Molecular Reorientation in Hybrid Lead Iodide Perovskites. J. Am. Chem. Soc. 2017, 139, 16875-16884. (e) Rosales, B. A.; Men, L.; Cady, S. D.; Hanrahan, M. P.; Rossini, A. J.; Vela, J. Persistent Dopants and Phase Segregation in Organolead Mixed-Halide Perovskites. Chem. Mater. 2016, 28, 6848-6859. (f) Franssen, W. M. J.; Van Es, S. G. D.; Dervisoylu, R.; De Wijs, G. A.; Kentgens, A. P. M. Symmetry, Dynamics, and Defects in Methylammonium Lead Halide Perovskites. J. Phys. Chem. Lett. 2017, 8, 61-66. (g) Prochowicz, D.; Yadav, P.; Saliba, M.; Kubicki, D. J.; Tavakoli, M. M.; Zakeeruddin, S. M.; Lewinski, J.; Emsley, L.; Grstzel, M. One-Step Mechanochemical Incorporation of an Insoluble Cesium Additive for High Performance Planar Heterojunction Solar Cells. Nano Energy 2018, 49, 523-528. (h) Wasylishen, R. E.; Knop, O.; Macdonald, J. B. Cation Rotation in Methylammonium Lead Halides. Solid State Commun. 1985, 56, 581-582. (i) Karmakar, A.; Askar, A. M.; Bernard, G. M.; Terskikh, V. V.; Ha, M.; Patel, S.; Shankar, K.; Michaelis, V. K. Mechanochemical Synthesis of Methylammonium Lead Mixed-Halide Perovskites: Unraveling the Solid-Solution Behavior Using Solid-State NMR. Chem. Mater. 2018, 30, 2309-2321. (j) Askar, A. M.; Karmakar, A.; Bernard, G. M.; Ha, M.; Terskikh, V. V.; Wiltshire, B. D.; Patel, S.; Fleet, J.; Shankar, K.; Michaelis, V. K. Composition-Tunable Formamidinium Lead Mixed Halide Perov skites via Solvent-Free Mechanochemical Synthesis: Decoding the Pb Environments Using Solid-State NMR Spectroscopy. J. Phys. Chem. Lett. 2018, 9, 2671-2677. (k) Bernard, G. M.; Goyal, A.; Miskolzie, M.; McKay, R.; Wu, Q.; Wasylishen, R. E.; Michaelis, V. K. Methylammonium Lead Chloride: A Sensitive Sample for an Accurate NMR Thermometer. J.

Magn. Reson. 2017, 283, 14-21. (I) Bernard, G. M.; Wasylishen, R. E.; Ratcliffe, C. I.; Terskikh, V.; Wu, Q.; Buriak, J. M.; Hauger, T. Methylammonium Cation Dynamics in Methylammonium Lead Halide Perovskites: A Solid-State NMR Perspective. J. Phys. Chem. A 2018, 122, 1560-1573. (m) Kubicki, D. J.; Prochowicz, D.; Hofstetter, A.; Saski, M.; Yadav, P.; Bi, D.; Pellet, N.; Lewiński, J.; Zakeeruddin, S. M.; Grätzel, M.; et al. Formation of Stable Mixed Guanidinium-Methylammonium Phases with Exceptionally Long Carrier Lifetimes for High-Efficiency Lead Iodide-Based Perovskite Photovoltaics. J. Am. Chem. Soc. 2018, 140, 3345-3351. (n) Kubicki, D. J.; Prochowicz, D.; Hofstetter, A.; Zakeeruddin, S. M.; Grätzel, M.; Emsley, L. Phase Segregation in Cs-, Rb- and K-Doped Mixed-Cation $(MA)_x(FA)_{1-x}PbI_3$ Hybrid Perovskites from Solid-State NMR. J. Am. Chem. Soc. 2017, 139, 14173-14180. (o) Kubicki, D. J.; Prochowicz, D.; Hofstetter, A.; Péchy, P.; Zakeeruddin, S. M.; Grstzel, M.; Emsley, L. Cation Dynamics in Mixed-Cation $(MA)_x(FA)_{1-x}PbI_3$ Hybrid Perovskites from Solid-State NMR. J. Am. Chem. Soc. 2017, 139, 10055-10061.

[41] Faucher, A.; Terskikh, V. V.; Wasylishen, R. E. Assessing Distortion of the $AF_6$ (A=As, Sb) Octahedra in Solid Hexafluorometallates (V) via NMR Spectroscopy. Can. J. Chem. 2015, 93, 938-944.

[42] Harris, R. K.; Becker, E. D.; de Menrzes, S. M. C.; Goodfellow, R.; Granger, P. Commission on Molecular Structure and Spectroscopy. Pure Appl. Chem. 2001, 73, 1795-1818.

[43] Bertini, I.; Luchinat, C.; Parigi, G.; Ravera, E. NMR of Paramagnetic Molecules; Elsevier: 2016.

[44] Kurland, R. J.; Mcgarvey, B. R. Isotropic NMR Shifts in Transition Metal Complexes: The Calculation of the Fermi Contact and Pseudocontact Terms. J. Magn. Reson. 1970, 2, 286-301.

[45] Walder, B. J.; Patterson, A. M.; Baltisberger, J. H.; Grandinetti, P. J. Hydrogen Motional Disorder in Crystalline Iron Group Chloride Dihydrates. J. Chem. Phys. 2018, 149, 084503.

[46] (a) Van Vleck, J. H. The Theory of Electric and Magnetic Susceptibilities; Oxford University Press: 1932; p 226. (b) Kurland, R. J.; Mcgarvey, B. R. Isotropic NMR Shifts in Transition Metal Complexes: The Calculation of the Fermi Contact and Pseudocontact Terms. J. Magn. Reson. 1970, 2, 286-301. (c) Walder, B. J.; Patterson, A. M.; Baltisberger, J. H.; Grandinetti, P. J. Hydrogen Motional Disorder in Crystalline Iron Group Chloride Dihydrates. J. Chem. Phys. 2018, 149, 084503.

[47] (a) Michaelis, V. K.; Greer, B. J.; Aharen, T.; Greedan, J. E.; Kroeker, S. Determining Electron Spin-Transfer Mechanisms in Paramagnetic Ba2YMO6 (M=Mo, Re, Ru) Double Perovskites by $^{89}Y$ and $^{137}Ba$ MAS NMR Spectroscopy. J. Phys. Chem. C 2012, 116, 23646-23652. (b) Carlier, D.; Menetrier, M.; Grey, C. P.; Delmas, C.; Ceder, G. Understanding the NMR Shifts in Paramagnetic Transition Metal Oxides Using Density Functional Theory Calculations. Phys. Rev. B: Condens. Matter Mater. Phys. 2003, 67, 174103.

[48] La Mar, G. N.; Horrocks, W. E.; Holm, R. H. NMR of Paramagnetic Molecules; Academic Press: 1973.

[49] (a) Wickramasinghe, N. P.; Ishii, Y. Sensitivity Enhancement, Assignment, and Distance Measurement in $^{13}C$ Solid-State NMR Spectroscopy for Paramagnetic Systems under Fast Magic Angle Spinning. J. Magn. Reson. 2006, 181, 233-243. (b) Ooms, K.; Polenova, T.; Shough, A.; Doren, D. J.; Nash, M. J.; Lobo, R. F. Identification of Mixed Valence Vanadium in ETS-10 Using Electron Paramagnetic Resonance, $^{51}V$ Solid-State Nuclear Magnetic Resonance, and Density Functional Theory Studies. J. Phys. Chem. C 2009, 113, 10477-10484. (c) Kermarrec, E.; Marjerrison, C. A.; Thompson, C. M.; Maharaj, D. D.; Levin, K.; Kroeker, S.; Granroth, G. E.; Flacau, R.; Yamani, Z.; Greedan, J. E.; Gaulin, B. D.; et al. Frustrated FCC Antiferromagnet $Ba_2YOsO_6$: Structural Characterization, Magnetic Properties, and Neutron Scattering Studies. Phys. Rev. B: Condens. Matter Mater. Phys. 2015, 91, 075133. (d) Grey, C. P.; Dupre, N. NMR Studies of Cathode Materials for Lithium-Ion Rechargeable Batteries. Chem. Rev. 2004, 104, 4493-4512. (e) Ishii, Y.; Wickramasinghe, N. P.; Chimon, S. A New Approach in 1D and 2D $^{13}C$ High-Resolution Solid-State NMR Spectroscopy of Paramagnetic Organometallic Complexes by Very Fast Magic-Angle Spinning. J. Am. Chem. Soc. 2003, 125, 3438-3439. (f) Aguiar, P. M.; Katz, M. J.; Leznoff, D. B.; Kroeker, S. Natural Abundance $^{13}C$ and $^{15}N$ Solid-state NMR Analysis of Paramagnetic Transition-metal Cyanide Coordination Polymers. Phys. Chem. Chem. Phys. 2009, 11, 6925-6934. (g) Grey, C. P.; Smith, M. E.; Cheetham, A. K.; Dobson, C. M.; Dupree, R. MAS NMR Study of Rare-Earth Pyrochlores: Paramagnetic Shifts in the Solid State. J. Am. Chem. Soc. 1990, 112, 4670-4675. (h) Brough, A. R.; Grey, C. P.; Dobson, C. M. Paramagnetic Ions as Structural Probes in Solid-State NMR: Distance Measurements in Crystalline Lanthanide Acetates. J. Am. Chem. Soc. 1993, 115, 7318-7327. (i) Bertarello, A.; Schubeis, T.; Fuccio, C.; Ravera, E.; Fragai, M.; Parigi, G.; Emsley, L.; Pintacuda, G.; Luchinat, C. Paramagnetic Properties of a Crystalline Iron-Sulfur Protein by Magic-Angle Spinning NMR Spectroscopy. Inorg. Chem. 2017, 56, 6624-6629. (j) Pell, A. J.; Middlemiss, D. S.; Strobridge, F. C.; Miller, J. K.; Cle, J.; Whittingham, M. S.; Emsley, L.; Grey, C. P.; Pintacuda, G. Spin-Transfer Pathways in Paramagnetic Lithium Transition-Metal Phosphates from Combined Broadband Isotropic Solid-State MAS NMR Spectroscopy and DFT Calculations. J. Am. Chem. Soc. 2012, 134, 17178-17185. (k) Liu, K.; Ryan, D.; Nakanishi, K.; Mcdermott, A. Solid State NMR Studies of Paramagnetic Coordination Complexes: A Comparison of Protons and Deuterons in Detection and Decoupling. J. Am. Chem. Soc. 1995, 117, 6897-6906.

[50] Cortecchia, D.; Dewi, H. A.; Yin, J.; Bruno, A.; Chen, S.; Baikie, T.; Boix, P. P.; Grätzel, M.; Mhaisalkar, S.; Soci, C.; et al. Lead-Free $MA_2CuCl_xBr_{4-x}$ Hybrid Perovskites. Inorg. Chem. 2016, 55, 1044-1052.

[51] Helmholz, B. L.; Kruh, R. F. The Crystal Structure of Cesium Chlorocuprate, $Cs_2CuCl_4$, and the Spectrum of the Chlorocuprate Ion. J. Am. Chem. Soc. 1952, 74, 1176-1181.

[52] Faucher, A.; Terskikh, V. V; Wasylishen, R. E. Assessing Distortion of the $AF_6$ (A=As, Sb) Octahedra in Solid Hexafluorometallates (V) via NMR Spectroscopy. Can. J. Chem. 2015, 93, 938-944.

[53] Filip, M. R.; Verdi, C.; Giustino, F. G. W. Band Structures and Carrier Effective Masses of $CH_3NH_3PbI_3$ and Hypothetical Perov-skites of the Type $APbI_3$: $A=NH_4$, $PH_4$, $AsH_4$, and $SbH_4$. J. Phys. Chem. C 2015, 119, 25209-25219.

The invention claimed is:

1. An inorganic copper-doped double perovskite of the formula (I):

$$Cs_2Sb_{1-a}Ag_{1-b}Cu_{2x}Z_6 \qquad (I)$$

wherein
Z is Cl or Br;
a+b=2x; and
x is in the range of from about 0.005 to about 0.25.

2. The inorganic copper-doped double perovskite of claim 1, wherein Z is Cl.

3. The inorganic copper-doped double perovskite of claim 1, wherein x is in the range of from about 0.005 to about 0.015.

4. The inorganic copper-doped double perovskite of claim 1, wherein x is about 0.10.

5. The inorganic copper-doped double perovskite of claim 1, having an optical indirect bandgap of less than 2.65 eV, as determined using a UV-Vis NIR spectrophotometer with each measurement being acquired between the wavelengths of 2500 nm and 200 nm.

6. The inorganic copper-doped double perovskite of claim 1, having an optical indirect bandgap of from about 1 eV to about 1.4 eV, as determined using a UV-Vis NIR spectrophotometer with each measurement being acquired between the wavelengths of 2500 nm and 200 nm.

7. The inorganic copper-doped double perovskite of claim 5, having no substantial change in the optical indirect bandgap, or having no substantial change in $^{133}$Cs magic-angle spinning nuclear magnetic resonance spectrum, powder x-ray diffraction pattern and/or absorption spectrum, after being subjected to a relative humidity of about 55% at a temperature of about 295K for a period of about 365 days.

8. The inorganic copper-doped double perovskite of claim 5, having no substantial change in the optical indirect bandgap, or having no substantial change in $^{133}$Cs magic-angle spinning nuclear magnetic resonance spectrum, powder x-ray diffraction pattern and/or absorption spectrum, after being subjected to a temperature of about 110° C. for a period of about 6 days.

9. A device comprising a semiconducting material, wherein the semiconducting material comprises, consists essentially of or consists of an inorganic copper-doped double perovskite as defined in claim 1.

10. The device of claim 9, wherein the device is a photovoltaic device, a thermoelectric device, a magneto-electric device or a magneto-optic device.

11. The device of claim 10, wherein the photovoltaic device is a solar cell or a semiconductor and the thermo-electric device is a sensor or a heat transfer device.

12. The device of claim 9, wherein the device is a photovoltaic device.

13. The device of claim 9, wherein the device comprises:
a layer comprising an n-type material;
a layer comprising a p-type material; and
wherein the semiconducting material is between the layer comprising the n-type material and the layer comprising the p-type material.

14. The device of claim 13, wherein the device is a solar cell, and the device further comprises a cathode that is coupled to the layer comprising the p-type material and an anode that is coupled to the layer comprising the n-type material.

15. A method of tuning the bandgap of a $Cs_2SbAgZ_6$ double perovskite, wherein Z is Cl or Br, the method comprising doping the double perovskite with copper to obtain an inorganic copper-doped double perovskite of the formula (I):

$$Cs_2Sb_{1-a}Ag_{1-b}Cu_{2x}Z_6 \qquad (I)$$

wherein
Z is Cl or Br;
a+b=2x; and
x is in the range of from about 0.005 to about 0.25.

16. The method of claim 15, wherein Z is Cl.

17. The method of claim 16, wherein the inorganic copper-doped double perovskite is prepared by a method comprising:
(i) dissolving $Sb_2O_3$ and AgCl in an aqueous solution comprising HCl; and
(ii) adding CsCl and $CuCl_2.2H_2O$ to the solution obtained in step (i).

18. The method of claim 17, wherein prior to addition of the solution obtained in step (i), the $CuCl_2.2H_2O$ is dissolved in an aqueous solution comprising HCl.

19. The method of claim 17, wherein the $Sb_2O_3$ and AgCl are dissolved in the aqueous solution comprising HCl, while heating.

20. The method of any one of claim 17, wherein the mixture obtained in step (ii) is heated for a time of about 0.5 to about 1.5 hours then allowed to stand at ambient temperature for a time of about 1 hour to about 4 hours.

* * * * *